United States Patent
Nishimura

(10) Patent No.: US 9,877,393 B2
(45) Date of Patent: Jan. 23, 2018

(54) LAMINATED ELECTRONIC COMPONENT AND LAMINATED ELECTRONIC COMPONENT MOUNTING STRUCTURE

(71) Applicant: KYOCERA Corporation, Kyoto-shi, Kyoto (JP)

(72) Inventor: Michiaki Nishimura, Higashine (JP)

(73) Assignee: KYOCERA Corporation, Kyoto-Shi, Kyoto (JP)

( * ) Notice: Subject to any disclaimer, the term of this patent is extended or adjusted under 35 U.S.C. 154(b) by 0 days.

(21) Appl. No.: 15/107,175

(22) PCT Filed: Dec. 24, 2014

(86) PCT No.: PCT/JP2014/084199
§ 371 (c)(1),
(2) Date: Jun. 22, 2016

(87) PCT Pub. No.: WO2015/098990
PCT Pub. Date: Jul. 2, 2015

(65) Prior Publication Data
US 2017/0042029 A1 Feb. 9, 2017

(30) Foreign Application Priority Data

Dec. 24, 2013 (JP) .................. 2013-265494
Dec. 25, 2013 (JP) .................. 2013-267388
(Continued)

(51) Int. Cl.
*H01G 2/06* (2006.01)
*H01K 1/18* (2006.01)
(Continued)

(52) U.S. Cl.
CPC ............. *H05K 1/181* (2013.01); *H01G 2/06* (2013.01); *H01G 4/12* (2013.01); *H01G 4/228* (2013.01);
(Continued)

(58) Field of Classification Search
CPC .. H01G 4/30; H01G 2/06; H01G 4/12; H01G 4/232; H01G 4/228; H05K 1/111; H05K 1/181; H05K 2201/10015
See application file for complete search history.

(56) References Cited

U.S. PATENT DOCUMENTS

| 4,208,005 A * | 6/1980 | Nate ...................... C08F 290/14 |
| | | 156/275.5 |
| 5,639,010 A * | 6/1997 | Todd ...................... H05K 3/305 |
| | | 228/175 |

(Continued)

FOREIGN PATENT DOCUMENTS

| JP | 62-135426 U | 8/1987 |
| JP | 03-209806 A | 9/1991 |

(Continued)

OTHER PUBLICATIONS

International Search Report, PCT/JP2014/084199, dated Apr. 7, 2015, 2 pgs.
(Continued)

*Primary Examiner* — Hoa C Nguyen
(74) *Attorney, Agent, or Firm* — Volpe and Koenig, P.C.

(57) ABSTRACT

A laminated electronic component includes a main body composed of a stacked body in which dielectric layers and internal electrode layers are alternately laminated, and an external electrode disposed on an outer surface of the stacked body so as to make electrical connection with the internal electrode layers; and a first joining member and a second joining member which are provided on a first face
(Continued)

side located in a stacking direction of the dielectric layers and the inner electrode layers. The first joining member and the second joining member are provided on a first side and second side which constitute the first face, respectively, and located in a region which includes midpoints thereof but does not include a vertex of the main body. By mounting such a laminated electronic component to a substrate via the joining members, acoustic noise can be suppressed.

4 Claims, 28 Drawing Sheets

(30) Foreign Application Priority Data

Jan. 29, 2014 (JP) .................................. 2014-014433
Feb. 17, 2014 (JP) .................................. 2014-027602

(51) Int. Cl.
| | | |
|---|---|---|
| *H05K 1/18* | (2006.01) | |
| *H01G 4/30* | (2006.01) | |
| *H01G 4/12* | (2006.01) | |
| *H01G 4/228* | (2006.01) | |
| *H01G 4/232* | (2006.01) | |
| *H05K 1/11* | (2006.01) | |
| *H05K 1/02* | (2006.01) | |
| *H05K 3/30* | (2006.01) | |
| *H05K 3/32* | (2006.01) | |
| *H05K 3/34* | (2006.01) | |

(52) U.S. Cl.
CPC ............... *H01G 4/232* (2013.01); *H01G 4/30* (2013.01); *H05K 1/111* (2013.01); *H05K 1/0271* (2013.01); *H05K 3/305* (2013.01); *H05K 3/321* (2013.01); *H05K 3/3442* (2013.01); *H05K 2201/09418* (2013.01); *H05K 2201/10015* (2013.01); *Y02P 70/611* (2015.11)

(56) References Cited

U.S. PATENT DOCUMENTS

| | | | |
|---|---|---|---|
| 7,362,559 B2* | 4/2008 | Tominaga | H01G 4/232 361/306.1 |
| 8,054,608 B2* | 11/2011 | Yoon | H01G 4/224 361/305 |
| 8,119,450 B2* | 2/2012 | Ahmad | H01L 21/563 257/E23.023 |
| 2008/0145551 A1 | 6/2008 | Kunishi et al. | |
| 2009/0086403 A1 | 4/2009 | Lee et al. | |
| 2013/0056252 A1 | 3/2013 | Fujii et al. | |
| 2013/0233606 A1 | 9/2013 | Fujii et al. | |
| 2013/0294009 A1 | 11/2013 | Takeuchi et al. | |
| 2014/0008116 A1 | 1/2014 | Fujii et al. | |
| 2014/0268487 A1 | 9/2014 | Yoshida | |

FOREIGN PATENT DOCUMENTS

| | | |
|---|---|---|
| JP | 2002-234729 A | 8/2002 |
| JP | 2007-103496 A | 4/2007 |
| JP | 2009-088516 A | 4/2009 |
| JP | 2013-065820 A | 4/2013 |
| JP | 2013-232606 A | 11/2013 |
| JP | 2014-179512 A | 9/2014 |
| WO | 2007/105395 A1 | 9/2007 |

OTHER PUBLICATIONS

Japanese Office Action with English concise explanation, Japanese Patent Application No. 2015-554973, dated Aug. 8, 2017, 19 pgs.

* cited by examiner (a)

(b)

(c)

(a)

(b)

(c)

(a)

(b)

(a)

(b)

(a)

(b)

LAMINATED ELECTRONIC
COMPONENT MOUNTING STRUCTURE

TECHNICAL FIELD

The present invention relates to a laminated electronic component and a laminated electronic component mounting structure.

BACKGROUND ART

In an electronic component of laminated-type composed of a stack of dielectric layers and internal electrode layers, when DC voltage and AC voltage are simultaneously applied to the electronic component, strain occurs in the dielectric layer due to voltage-induced electrostrictive effect, causing vibration in the electronic component in itself. In response to the vibration of the electronic component, a substrate having the electronic component mounted thereon by a solder or the like is vibrated, and, when resonance occurs in the substrate at a resonance frequency in an audio frequency range, vibration sound is generated, which is called a "acoustic noise" phenomenon.

Various proposals to suppress such a "acoustic noise" have been made to date, for example, a method for reducing vibration by relieving strain in an electronic component in itself (with use of, for example, a low-permittivity material which produces low electrostrictive effect, or an internal electrode pattern designed to reduce electrostrictive effect), and a method for restraining vibration of an electronic component from being transmitted to a substrate (by absorbing the vibration by, for example, a metallic terminal or lead, or by setting the height of a solder fillet properly). For example, Patent Literature 1 discloses a mounting structure in which an electrically conductive material serving as a medium for propagation of capacitor vibration is spaced away from a part of a capacitor which undergoes greatest vibration. In this structure, vibration is hardly transmitted to a circuit board.

CITATION LIST

Patent Literature

Patent Literature 1: Japanese Unexamined Patent Publication JP-A 2013-065820

SUMMARY OF INVENTION

Technical Problem

However, in the case of relieving strain in an electronic component in itself, for example, in a capacitor, desired capacitance cannot be attained due to lowness of material permittivity or smallness of capacitance development region. Furthermore, in the case of absorbing vibration by a metallic terminal or lead, or in the mounting structure as disclosed in Patent Literature 1, there is a problem that, in spite of complicated manufacturing process and mounting process, satisfactory vibration attenuation effect cannot be obtained.

The invention has been devised in view of the problems as discussed supra, and an object of the invention is to provide a laminated electronic component which is capable of suppressing acoustic noise when mounted on a substrate, and a laminated electronic component mounting structure.

Solution to Problem

A laminated electronic component according to one embodiment of the invention comprises: a main body composed of a stacked body in which dielectric layers and internal electrode layers are alternately laminated, and an external electrode disposed on an outer surface of the stacked body so as to make electrical connection with the internal electrode layers; and a joining member, the main body being shaped in a rectangular prism, and having a pair of a first face and a second face which are opposed to each other in a stacking direction of the dielectric layers and the internal electrode layers, and four side faces, the joining member being located in a region which includes at least one of a midpoint of at least one of four sides defining the first face and a line connecting midpoints of, out of the four sides, two opposed paired sides, but does not include a vertex of the main body.

Moreover, a laminated electronic component according to another embodiment of the invention comprises: a main body composed of a stacked body in which dielectric layers and internal electrode layers are alternately laminated, and an external electrode disposed on an outer surface of the stacked body so as to make electrical connection with the internal electrode layers; and a joining member, the main body being shaped in a rectangular prism, and having a pair of a first side face and a second side face which are opposed to each other in a direction perpendicular to a stacking direction of the dielectric layers and the internal electrode layers, sides defining the first side face including a first side, a second side opposed to the first side, and a pair of third sides contiguous to the first side and the second side, the joining member including a first joining member located on at least one of the first side and a region in the first face which is close to the first side, and a second joining member located on at least one of the second side and a region in the first face which is close to the second side, a center of the first side face, the paired third sides, and regions close to the third sides are each free of the joining member.

A laminated electronic component mounting structure according to still another embodiment of the invention comprises a substrate having a mounting face; and the above-described laminated electronic component, the joining member of the laminated electronic component being joined to the mounting face of the substrate, the first face or the first side face of the main body being opposed to the mounting face.

Advantageous Effects of Invention

The invention succeeds in providing a laminated electronic component which is capable of suppressing acoustic noise when mounted on a substrate, and a laminated electronic component mounting structure.

BRIEF DESCRIPTION OF DRAWINGS

FIG. 1(a) is an exploded perspective view thereof, FIG. 1(b) is a perspective view thereof, and FIG. 1(c) is a plan view thereof as seen from a first face;

FIG. 4(a) is a perspective view thereof, FIG. 4(b) is a plan view thereof as seen from the first face, and FIG. 4(c) is a plan view thereof as seen from the first face, illustrating the dimensions of constituent components;

FIG. 6(a) is a perspective view thereof, FIG. 6(b) is a plan view thereof as seen from a first face, and FIG. 6(c) is a plan view thereof as seen from the first face, illustrating the dimensions of constituent components;

FIG. 7(a) is a sectional view taken along the line A3-A3 shown in FIG. 6(b), and FIG. 7(b) is a sectional view taken along the line B3-B3 shown in FIG. 6(b);

FIG. 8(a) is a perspective view thereof, FIG. 8(b) is a plan view thereof as seen from the first face, and FIG. 8(c) is a plan view thereof as seen from the first face, illustrating the dimensions of constituent components;

FIG. 9(a) is a sectional view taken along the line A4-A4 shown in FIG. 8(b), and FIG. 9(b) is a sectional view taken along the line B4-B4 shown in FIG. 8(b);

FIG. 10(a) is a perspective view thereof, FIG. 10(b) is a plan view thereof as seen from a first side face, and FIG. 10(c) is a plan view thereof as seen from the first side face, illustrating the dimensions of constituent components;

FIG. 11(a) is a sectional view taken along the line A5-A5 shown in FIG. 10(b), and FIG. 11(b) is a sectional view taken along the line B5-B5 shown in FIG. 10(b);

FIG. 12(a) is a perspective view thereof, FIG. 12(b) is a plan view thereof as seen from a first face, and FIG. 12(c) is a plan view thereof as seen from the first face, illustrating the dimensions of constituent components;

FIG. 13(a) is a sectional view taken along the line A6-C6-D6-A6' shown in FIG. 12(b), and FIG. 13(b) is a sectional view taken along the line B6-B6 shown in FIG. 12(b);

FIG. 14(a) is a perspective view thereof, FIG. 14(b) is a plan view thereof as seen from the first face, and FIG. 14(c) is a plan view thereof as seen from the first face, illustrating the dimensions of constituent components;

FIG. 15(a) is a sectional view taken along the line A7-C7-D7-A7' shown in FIG. 14(b), and FIG. 15(b) is a sectional view taken along the line B7-B7 shown in FIG. 14(b);

FIG. 16(a) is an exploded perspective view thereof, FIG. 16(b) is a perspective view thereof, and FIG. 16(c) is a plan view thereof as seen from a first face;

FIG. 18(a) is a sectional view taken along the line A8-A8 shown in FIG. 16(c), and FIG. 18(b) is a sectional view taken along the line B8-B8 shown in FIG. 16(c);

FIG. 19(a) is an exploded perspective view thereof, FIG. 19(b) is a perspective view thereof, and FIG. 19(c) is a plan view thereof as seen from the first face;

FIG. 21(a) is a sectional view taken along the line A9-A9 shown in FIG. 19(c), and FIG. 21(b) is a sectional view taken along the line B9-B9 shown in FIG. 19(c);

FIG. 22(a) is a perspective view thereof, FIG. 22(b) is a plan view thereof as seen in a z-axis direction in the coordinates, and FIG. 22(c) is a sectional view of a mounting structure, which is constructed by mounting the laminated electronic component on a substrate, taken along the line A10-A10 shown in FIG. 22(b);

FIG. 24(a) is a graph indicating an actually measured sound pressure level, and FIG. 24(b) is a graph indicating a sound pressure level obtained by simulation;

FIG. 27(a) is a view of the model as seen from the plane of symmetry thereof, and FIG. 27(b) is a view of the model as seen from a surface thereof.

DESCRIPTION OF EMBODIMENTS

Figure 1:
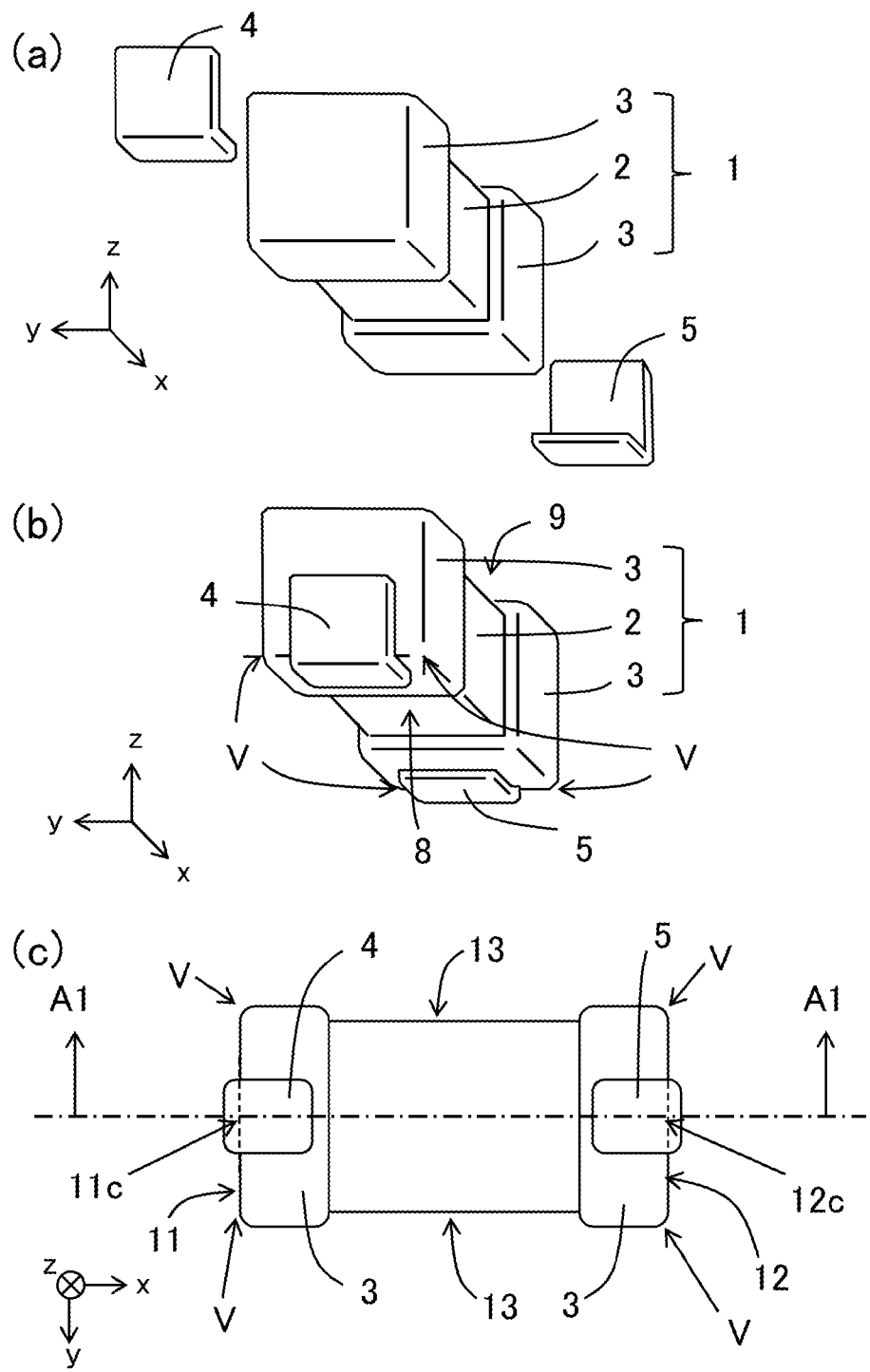
FIG. 1 is a view showing a laminated electronic component according to a first embodiment, and more specifically

A laminated electronic component and a laminated electronic component mounting structure will be described in detail with reference to drawings. Note that like reference characters refer to corresponding members and parts throughout the drawings, and overlapping descriptions will be omitted. Moreover, for the sake of facilitating explanation, each drawing bears x-y-z coordinate axes.

First Embodiment

As shown in FIGS. 1(a) to 1(c), a laminated electronic component in the first embodiment comprises: a main body 1 composed of a stacked body 2 and an external electrode 3 disposed on an outer surface of each end of the stacked body 2; a first joining member 4; and a second joining member 5. As shown in FIG. 2, the stacked body 2 is configured so that dielectric layers 6 and internal electrode layers 7 are alternately laminated. The internal electrode layer 7 is electrically connected to the external electrode 3 at one of the ends of the stacked body 2. The internal electrode layers 7 are electrically connected to different external electrodes 3 in an alternate manner. Upon the application of voltage to the external electrodes 3, capacitance is developed in the dielectric layer 6 held between paired internal electrode layers 7 connected to different external electrodes 3. In what follows, unless otherwise stated, a stacking direction of the dielectric layers 6 and the internal electrode layers 7 (hereafter also referred to simply as "stacking direction") coincides with a z-axis direction in the coordinates.

The main body 1 is, like a conventional laminated electronic component, shaped in a rectangular prism, and has a pair of a first face 8 and a second face 9 which are opposed to each other in the stacking direction, and four side faces. When the main body 1 is viewed from the first face 8, there are the rectangular face of the stacked body 2 and the faces of the external electrodes 3 located at either end of the stacked body 2. Although the external electrode 3 protrudes outward beyond the stacked body 2 in a y-axis direction, the amount of protrusion is far smaller than a width of the stacked body 2 in the y-axis direction. This holds true for the Z-axis direction. Thus, the main body 1 having such a configuration is considered as being shaped in a rectangular prism.

The first joining member 4 and the second joining member 5 are located on the first face 8 side of the main body 1. FIG. 1(c) is a plan view of the laminated electronic component according to this embodiment as seen from the first face 8.

FIG. 2 is a sectional view of the laminated electronic component according to this embodiment mounted on a substrate 21 taken along the line A1-A1 shown in FIG. 1(c). As shown in FIG. 2, the stacked body 2 is configured so that the dielectric layers 6 and the internal electrode layers 7 are alternately laminated. Note that the structure of the dielectric layers 6 and the internal electrode layers 7 is schematically shown in FIG. 2, and, in reality, a structure formed of a stack of several to hundreds of dielectric layers 6 and internal electrode layers 7 is generally used. This holds true for other embodiments that will hereafter be described.

As shown in FIG. 1(c), the first joining member 4 is formed so as to extend over a first side 11 defining the first face 8 and two faces adjoining the first side 11 while containing a midpoint 11c of the first side 11 but not containing a vertex V of the main body 1. The second joining member 5 is formed so as to extend over a second side 12 defining the first face 8 and two faces adjoining the second side 12 while containing a midpoint 12c of the second side 12 but not containing the vertex V of the main body 1. Third sides 13, which are each another side defining the first face 8 of the main body 1, are each free of the joining member. The midpoint 11c of the first side 11 corresponds to a bisection point in which the length of the first side 11 is bisected, and the midpoint 12c of the second side 12 corresponds to a bisection point in which the length of the second side 12 is bisected.

Figure 3:
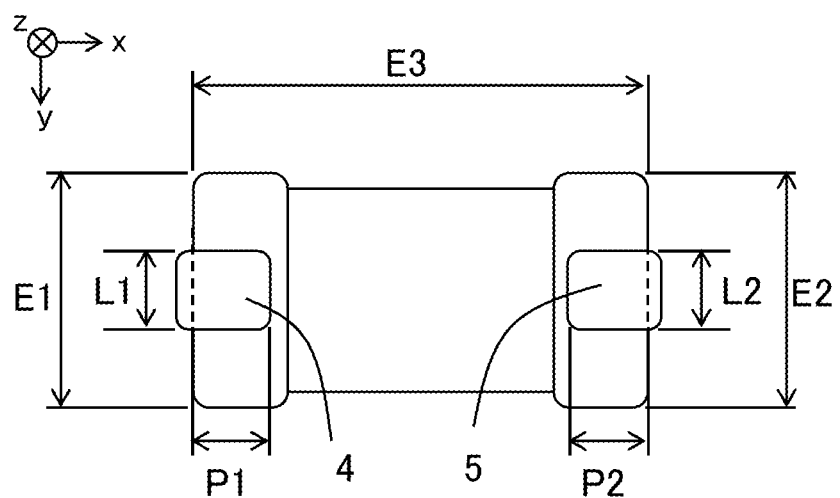
FIG. 3 is a plan view of the laminated electronic component according to the first embodiment as seen from the first face, illustrating the dimensions of constituent components.

In this embodiment, the first side 11 and the second side 12 are opposed to each other. As shown in FIG. 3, given that the length of the first side 11 is E1, the length of the second side is E2, and the length of the third side 13 is E3, the following relationship is satisfied: E1<E3, and E2<E3. Each of E1, E2, and E3 represents the length of the main body 1 including the external electrodes 3.

Moreover, as shown in FIG. 3, L1 represents the length of the first joining member 4 in the lengthwise direction of the first side 11, and L2 represents the length of the second joining member 5 in the lengthwise direction of the second side 12. P1 represents the length of a part of the first joining member 4 on the first face 8 which part extends from the first side 11 toward the center of the first face 8 in a direction perpendicular to the first side 11. P2 represents the length of a part of the second joining member 5 on the first face 8 which part extends from the second side 12 toward the center of the first face 8 in a direction perpendicular to the second side 12.

Moreover, as shown in FIG. 2, H0 represents the height of the main body 1 in the stacking direction, and H1 represents the length, in the stacking direction, of a part of the first joining member 4 which lies on one side face of the main body 1 that is contiguous to the first face 8. H2 represents the length, in the stacking direction, of a part of the second joining member 5 which lies on the other side face of the main body 1 that is contiguous to the first face 8. C represents a distance between the mounting face of the substrate 21 and the main body 1.

Figure 2:
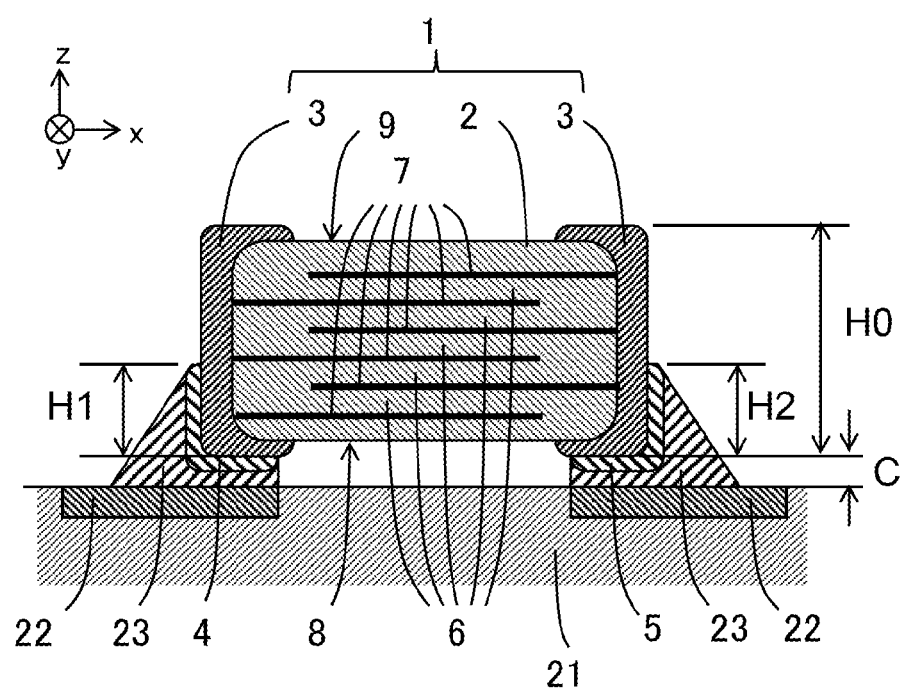
FIG. 2 is a sectional view showing a mounting structure, which is constructed by mounting the laminated electronic component according to the first embodiment on a substrate, taken along the line A1-A1 shown in FIG. 1(c)

In this embodiment, as shown in FIGS. 1 to 3, the first joining member 4 and the second joining member 5 are formed on surfaces of different external electrodes 3, and have electrical conductivity. As materials for forming the first joining member and the second joining member 5, use can be made of, for example, a brazing material such as eutectic solder and lead-free solder (Sn—Ag—Cu solder), and a conductive adhesive.

Modified Example

Figure 4:
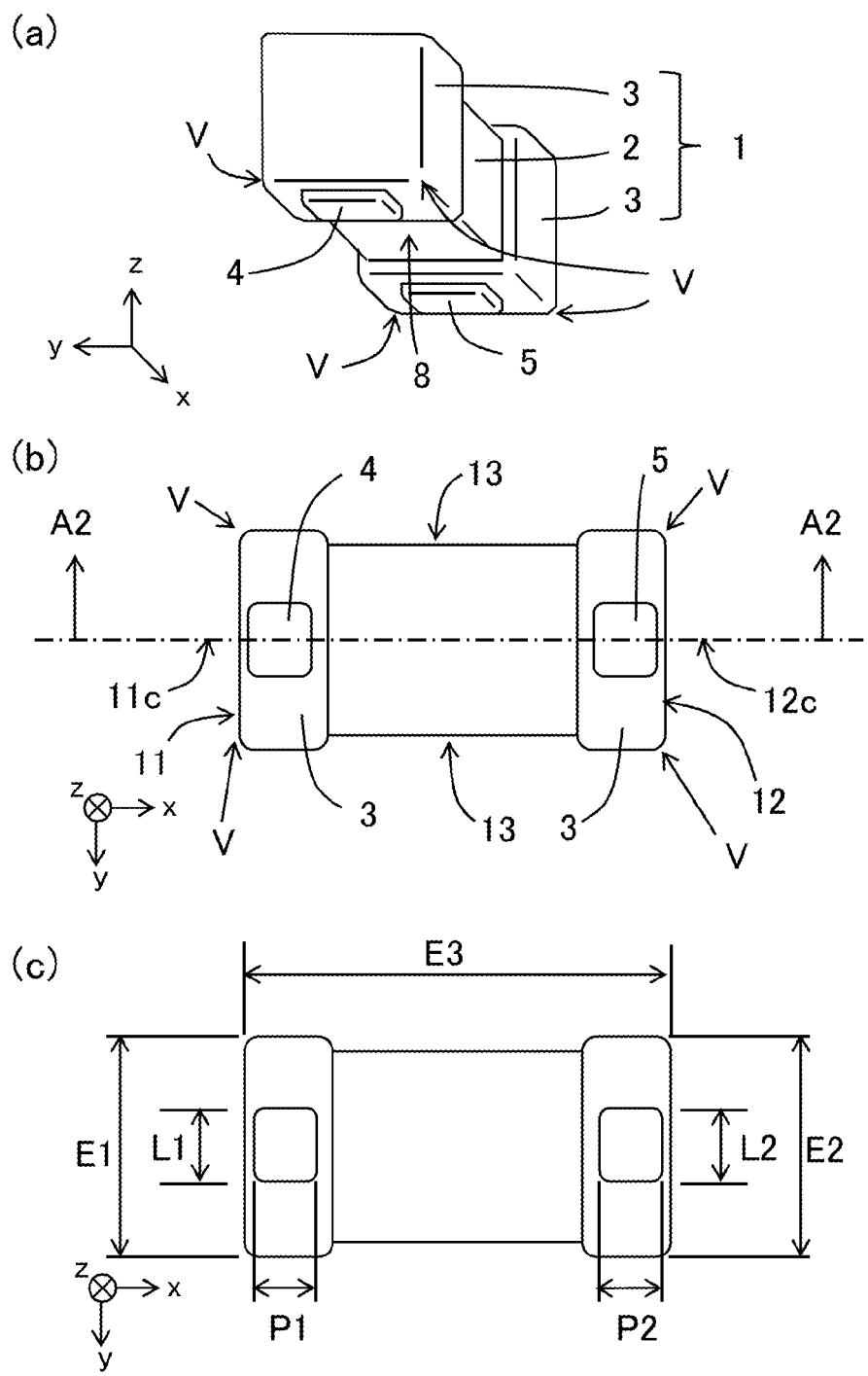
FIG. 4 is a view showing a modified example of the laminated electronic component according to the first embodiment, and more specifically

In FIG. 4, there is shown a modified example of the first embodiment (modified example 1). In this construction, the first joining member 4 and the second joining member 5 are spaced away from the first side 11 and the second side 12, respectively, so as to lie only on the first face 8. FIG. 4(b) is a plan view of the laminated electronic component in the modified example 1 as seen from the first face 8.

Figure 5:
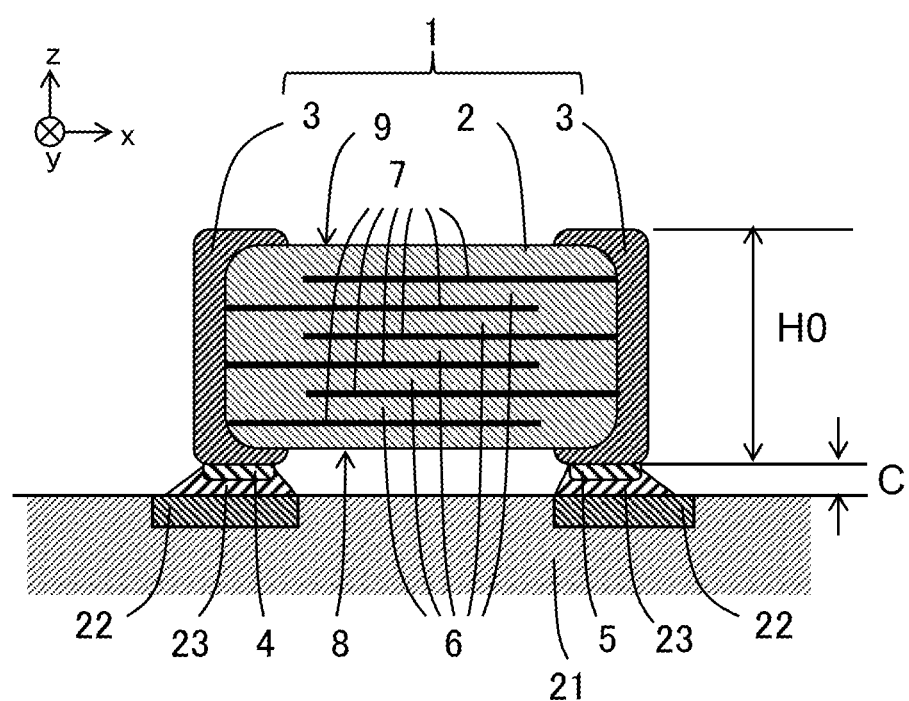
FIG. 5 is a sectional view of a mounting structure, which is constructed by mounting the modified example of the laminated electronic component according to the first embodiment on the substrate, taken along the line A2-A2 shown in FIG. 4(b)

FIG. 5 is a sectional view of the laminated electronic component in the modified example 1 mounted on the substrate 21 taken along the line A2-A2 shown in FIG. 4(b).

As shown in FIG. 4(b), the first joining member 4 is disposed in a region adjacent to the first side 11 on the first face 8. The second joining member 5 is disposed in a region adjacent to the second side 12 on the first face 8. There is no joining member in a region adjacent to the third side 13 which is another side defining the first face 8. The range of each of the regions that are adjacent to the first side 11, the second side 12, and the third side 13, respectively, on the first face 8 will hereafter be described.

Although the first joining member 4 and the second joining member 5 are spaced away from the first side 11 and the second side 12, respectively, in FIGS. 4 and 5, the first joining member 4 and the second joining member 5 may be placed in contact with the first side 11 and the second side 12, respectively.

For example, the first joining member 4 and the second joining member 5 may be formed on the main body 1 by printing a solder paste to predetermined positions on the main body 1, performing heat treatment at a melting temperature of the solder, and performing a cooling process. The formation may also be accomplished by adhering a solder ball to predetermined positions on the main body 1 with use of flux or low-melting-point solder. In this specification, for purposes of convenience, solder in solid form which adheres to the main body 1 as the first joining member 4, as well as the second joining member 5, will be referred to as solid solder regardless of its shape. Moreover, when using an electrically conductive paste to form the joining members, the first joining member 4 and the second joining member 5 may be formed by printing the conductive paste to the main body by screen printing or otherwise, and subsequently performing drying and heating process.

In a laminated electronic component mounting structure according this embodiment, as shown in FIGS. 2 and 5, the main body 1 is joined to a land pattern 22 on the substrate 21 via the first joining member 4 and the second joining member 5. In this embodiment, the first face 8 of the main body 1 and the mounting face of the substrate 21 are opposed to each other. The first joining member 4 and the second joining member 5 according to this embodiment serve to join the main body 1 to the substrate 21, as well as to provide electrical connection between the external electrode 3 of the main body 1 and a circuit (not shown) of the substrate 21.

To mount the laminated electronic component on the substrate 21, the laminated electronic component is placed, with the first joining member 4 and the second joining member 5 joined directly to the corresponding land patterns 22 of the substrate 21. As an alternative, an electrically conductive material such as solder is applied onto the land pattern 22 of the substrate 21, so that the laminated electronic component is mounted on the substrate 21 via the conductive material. In this case, the solder or the like applied onto the land pattern 22 constitutes a conductive layer 23 located between the first joining member 4 and the second joining member 5, and the land pattern 22. The conductive layer 23 is formed so as to make contact with the first joining member 4 and the second joining member 5, or to cover the first joining member 4 and the second joining member 5. It is preferable that the conductive layer 23 and the main body 1 are joined together via the first joining member 4 and the second joining member 5 to avoid direct contact between the conductive layer 23 and the main body 1. By joining the conductive layer 23 and the main body 1 together via the first joining member 4 and the second joining member 5, it is possible for the main body 1 to be joined, at its areas provided with the first joining member and the second joining member 5, respectively, to the land patterns 22 of the substrate 21. In the case of mounting the laminated electronic component on the substrate 21 bearing a conductive material as described above, although it is desirable to use the same material as that used for the first joining member 4 and the second joining member 5 as the conductive material, use can be made of any material which exhibits good wettability to the first joining member 4 and the second joining member 5 without limitation.

Figure 22:
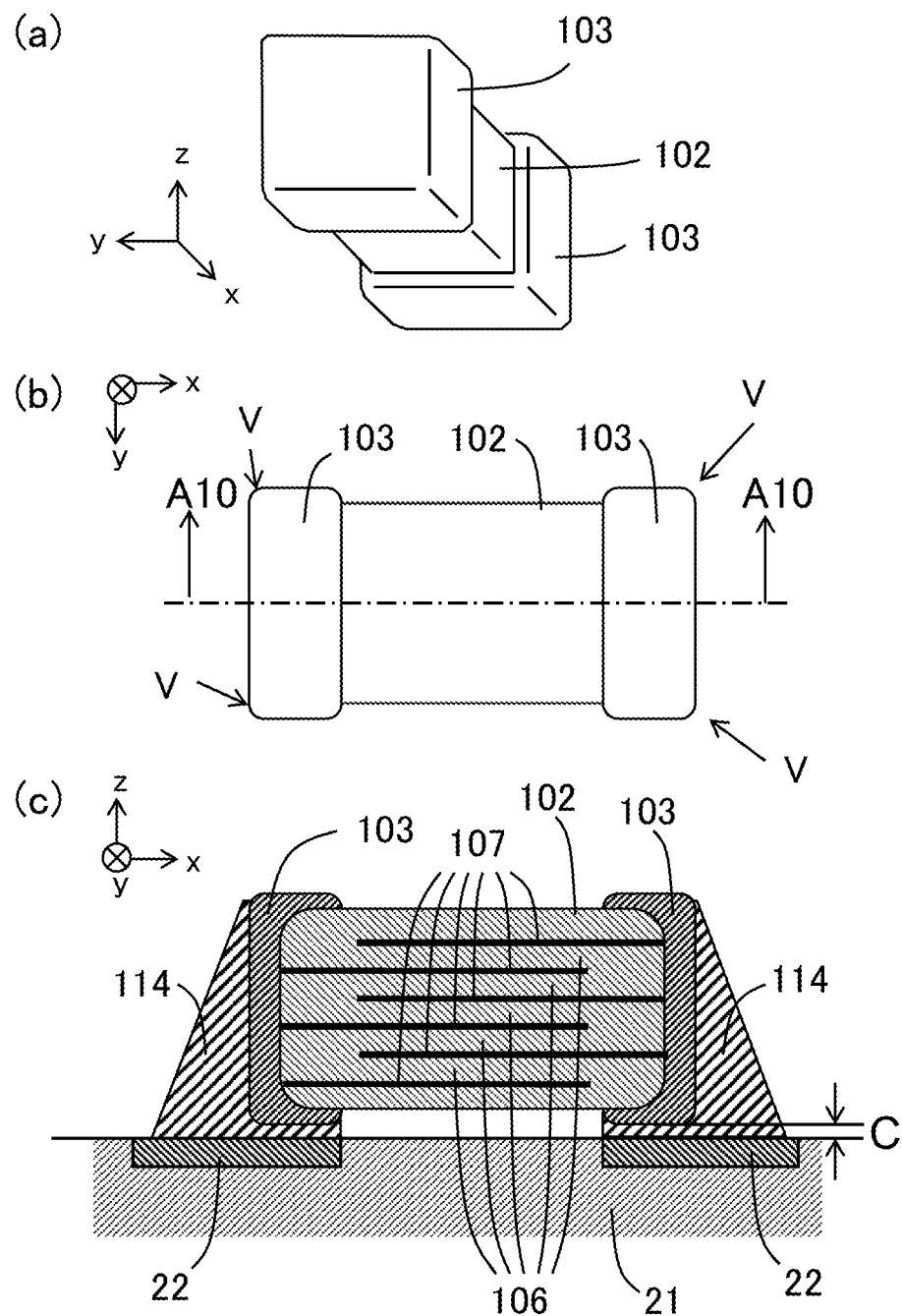
FIG. 22 is a view showing a conventional laminated electronic component, and more specifically

Meanwhile, as shown in FIG. 22(a), a conventional laminated electronic component comprises a stacked body 102 shaped in a rectangular prism and an external electrode 103 disposed on the outer surface of each end of the stacked body 102. FIG. 22(b) is a plan view of the construction shown in FIG. 22(a) as seen in the z-axis direction. FIG. 22(c) is a sectional view of the conventional laminated electronic component mounted on the substrate 21 taken along the line A10-A10 shown in FIG. 22(b).

As shown in FIG. 22(c), the stacked body 102 is configured so that dielectric layers 106 and internal electrode layers 107 are alternately laminated. The internal electrode layer 107 is electrically connected to the external electrode 103 at one of the ends of the stacked body 102.

For example, in a laminated ceramic capacitor which is one of laminated electronic components, a material having ferroelectricity such as barium titanate is used for the dielectric layer 106, and, a metal material such as Ni is used for the internal electrode layer 107. In general, the external electrode 103 in use is obtained by baking a Cu paste into a base electrode, and plating its surface with Ni and Sn.

In the conventional laminated electronic component, as shown in FIG. 22(c), the external electrode 103 and the land pattern 22 on the substrate 21 are secured to each other in a state where electrical connection via solder 114 is established. The solder 114 fills a gap between the external electrode 103 and the land pattern 22, and also covers the external electrode 103 which covers a side face, viz., an end, and part of the upper and lower surfaces of the stacked body 102. That is, the solder 114 is situated also on a vertex V of the laminated electronic component.

When DC voltage (DC bias) and AC voltage are applied to the laminated ceramic capacitor thus mounted, piezoelectric properties are imparted to the dielectric layer due to DC voltage-induced electrostrictive effect, and piezoelectric vibration occurs under AC voltage. Furthermore, the piezoelectric vibration of the laminated ceramic capacitor is transmitted, through the solder 114, to the substrate 21, causing vibration in the substrate 21. Consequently, when resonance occurs in the substrate 21 at a resonance frequency in an audio frequency range, vibration sound is generated, which is called a "acoustic noise" phenomenon.

By way of example, acoustic noise measurement was made on a laminated ceramic capacitor mounted as the conventional laminated electronic component on the substrate 21. In the measurement, a laminated ceramic capacitor of Type 1005 (10 µF in capacitance, 4 V in rated voltage), which will hereafter be also referred to as "evaluation component", was used as the laminated ceramic capacitor, and, a glass epoxy substrate made of an FR4 (Flame Retardant Type 4) material which has a dimension of 100× 40 mm, and a thickness of 0.8 mm was used as the substrate 21. The laminated ceramic capacitor was disposed centrally of the substrate 21 with use of Sn—Ag—Cu (SAC)-based solder. After mounting the evaluation component on the substrate 21, the condition of the mounting has been observed by a microscope. The result of observation has showed that the fillet height of the solder 114 is 460 μm and a distance C between the substrate 21 and the evaluation component is 45 μm.

Figure 23:
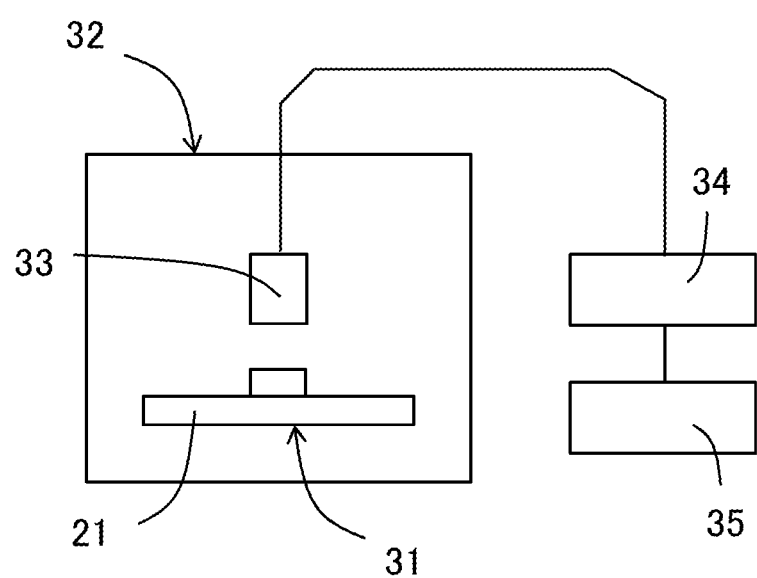
FIG. 23 is a schematic representation of a sound-pressure level measuring apparatus.

The acoustic noise measurement has been conducted by a sound-pressure level measuring instrument as shown in FIG. 23. A mounting substrate 31 constructed of the evaluation component mounted on the substrate 21 (hereafter also referred to simply as "mounting substrate") was placed in an anechoic box having an inside dimension of 600×700 mm, and a height of 600 mm, and, a sound-collecting microphone 33 was set in a position spaced a distance of 3 mm away from the center of the substrate 21 in a direction perpendicular to the substrate 21. Sound resulting from acoustic noise was collected by the sound-collecting microphone 33, and, the sound pressure level of the collected sound was measured by an amplifier 34 and an FET analyzer 35 (Model DS2100 manufactured by ONO SOKKI Co., LTD). The laminated ceramic capacitor received application of DC voltage (DC bias) of 4 V and AC voltage of 1 Vp-p within the range of 20 Hz to 20 kHz. The result of acoustic noise measurement obtained at this time is shown in FIG. 24(a).

Figure 24:
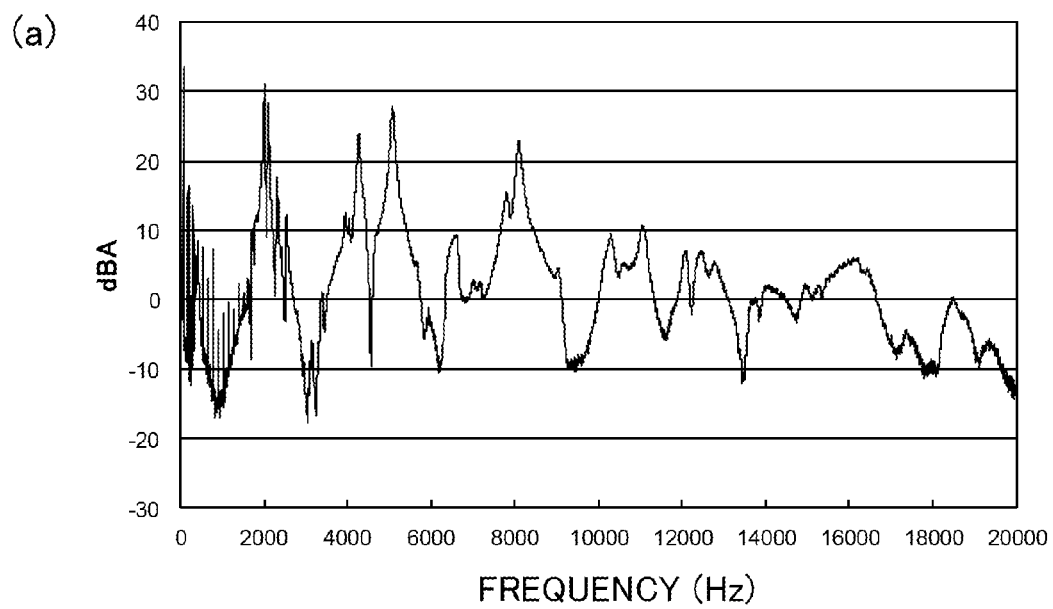
FIG. 24 is a graph indicating the sound pressure level of sound resulting from acoustic noise in a conventional laminated ceramic capacitor, and more specifically
Figure 24:
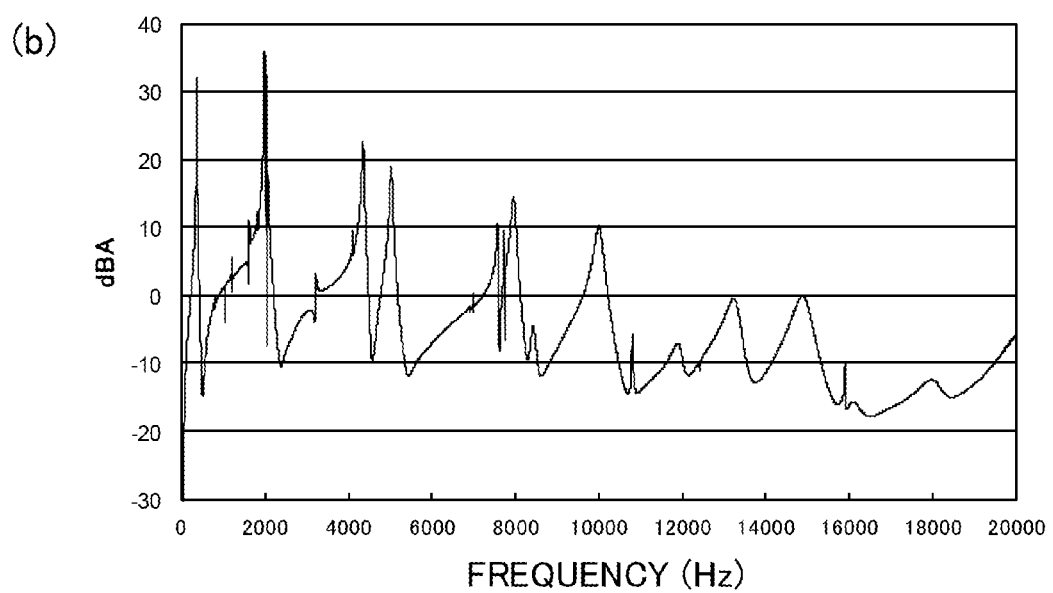

In FIG. 24(a), sound pressure levels are represented as A-weighted sound pressure levels (dBA). An A-weighted sound pressure level of 0 dBA is equivalent to the lowest sound pressure level of audible sound that can be perceived by human beings. The A-weighted sound pressure level refers to a sound pressure level weighted on a frequency-by-frequency basis so as to be close to the level of human hearing, which is described in Specifications for Sound Level Meters (Noise Level Meters) (JIS C 1509-1: 2005).

Figure 25:
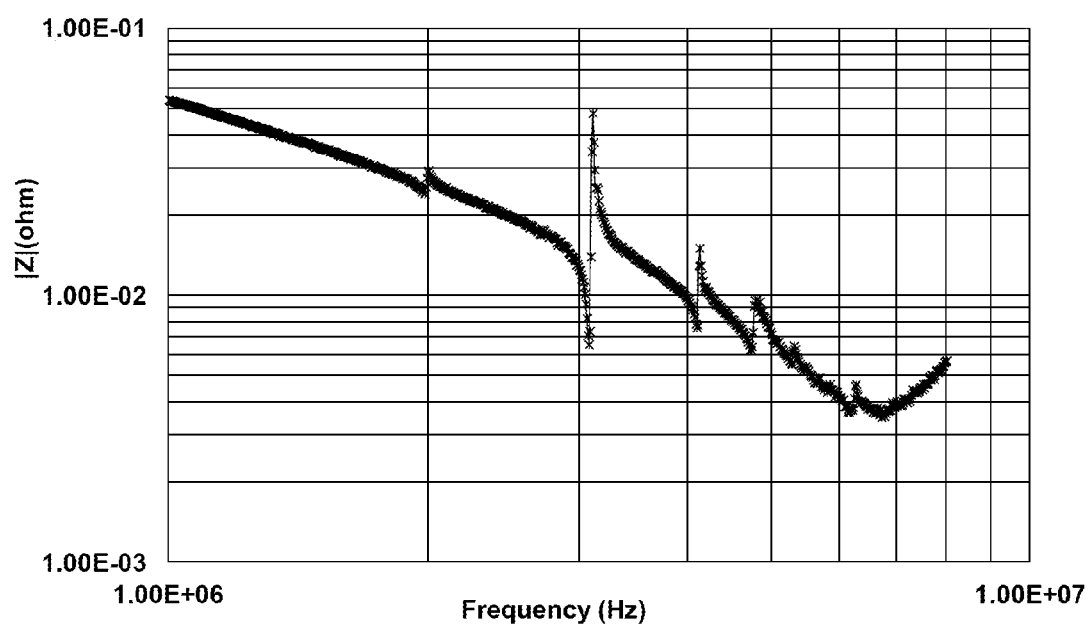
FIG. 25 is a graph indicating the result of impedance measurement made on a unitary conventional laminated ceramic capacitor subjected to application of DC bias of 4 V.

Next, simulation was made on the conventional laminated ceramic capacitor in respect of piezoelectric vibration. To begin with, impedance measurement was made on the evaluation component under applied DC voltage (DC bias) of 4 V. The result of the measurement is shown in FIG. 25.

Figure 26:
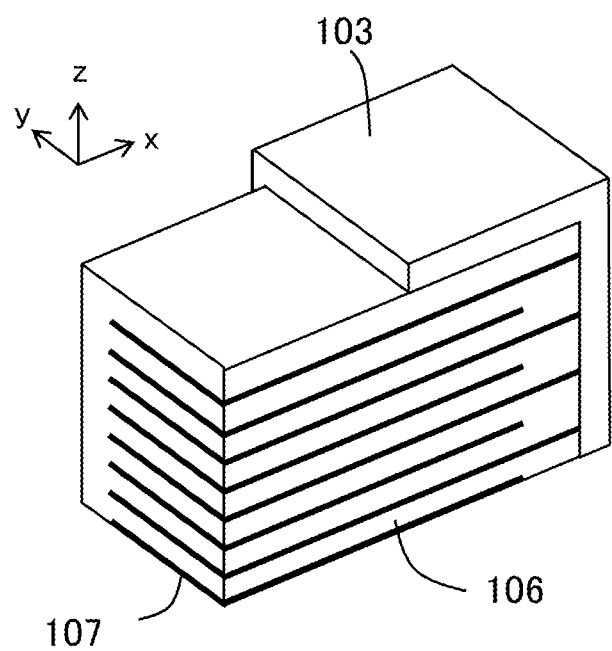
FIG. 26 is a schematic view of a model based on the finite element method used for impedance analysis made on the conventional laminate ceramic capacitor.

Moreover, simulation was made on a model based on the evaluation component (dielectric material: barium titanate-based material, internal electrode: Ni, external electrode: Cu, stacked body dimensions: 1100×620×620 μm, external electrode thickness: 20 μm) in respect of impedance. Material parameter fitting was performed on the evaluation component so that a peak of piezoelectric resonance found in a range of frequencies of 2 GHz and above conforms to the actually measured value. FIG. 26 is a view schematically showing the model based on the finite element method used for the impedance simulation. This model is a one-eighth scale model built with consideration given to symmetry, in which two sections and lower sections that appear to the front in FIG. 26 are defined as the plane of symmetry.

Parameters (elastic stiffness and piezoelectric constant $e_{ij}$) of the dielectric layer 106 obtained by parameter fitting are shown in Table 1. It will be understood from Table 1 that the material characteristics of the dielectric layer 106 of the evaluation component involve anisotropy ($c_{11} > c_{33}$, and $c_{22} > c_{33}$). This is ascribable to compressive stress exerted by the internal electrode layer 107.

TABLE 1

| Elastic stiffness and Piezoelectric constant of Dielectric layer | |
|---|---|
| $c_{11}^E$ | $281.5 \times 10^9$ N/m² |
| $c_{12}^E$ | $117.2 \times 10^9$ N/m² |
| $c_{13}^E$ | $57.2 \times 10^9$ N/m² |
| $c_{22}^E$ | $230.8 \times 10^9$ N/m² |
| $c_{23}^E$ | $57.2 \times 10^9$ N/m² |
| $c_{33}^E$ | $104.3 \times 10^9$ N/m² |
| $c_{44}^E$ | $30.9 \times 10^9$ N/m² |
| $c_{55}^E$ | $30.9 \times 10^9$ N/m² |
| $c_{66}^E$ | $68.9 \times 10^9$ N/m² |
| $e_{31}$ | $-22.2$ C/m² |
| $e_{32}$ | $-27.8$ C/m² |
| $e_{33}$ | $4.75$ C/m² |
| $e_{15}$ | $2.94$ C/m² |
| $e_{24}$ | $2.94$ C/m² |

A model of the mounting structure was formed on the basis of the thereby obtained parameters of the dielectric layer 106 and the mounting substrate 31 used for measurement (fillet height: 460 μm, substrate-to-evaluation component distance: 45 μm), and simulation was made on this model. FIG. 24(b) is a graph indicating the amplitude of vibration, expressed in terms of A-weighted sound pressure level, in the mounting substrate 31 obtained by the simulation. Acoustic noise frequency characteristics are dependent on the vibration characteristics of the evaluation component and the resonant mode of the mounting substrate 31. The simulation result shown in FIG. 24(b) has thus indicated that the values of each of sound pressure level and frequency characteristics are in good agreement with the corresponding actually measured values shown in FIG. 24(a) in a range of low frequencies of 10 kHz and below characterized by particularly high sound pressure. Thus, simulation using the parameters makes it possible to examine the influence of acoustic noise on the mounting structure entailed by a change in the mounting structure.

Figure 27:
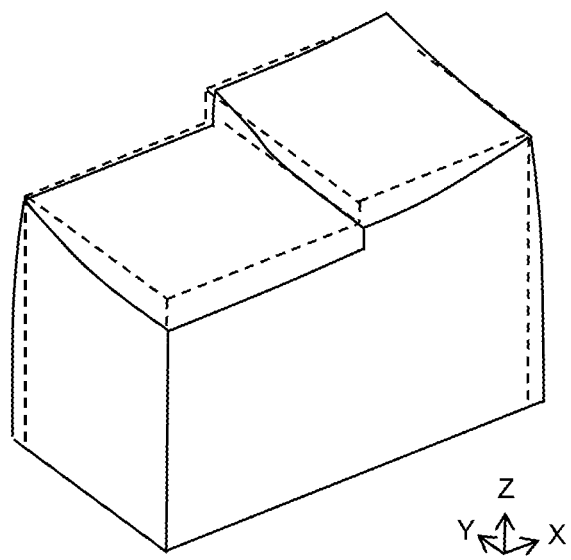
FIG. 27 is a perspective view showing the result of calculation as to a vibration mode at 10 kHz in the unitary conventional laminated ceramic capacitor, and more specifically
Figure 27:
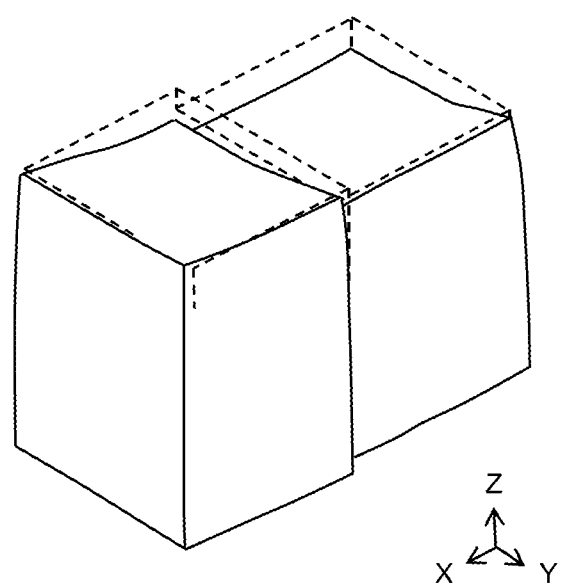
Figure 28:
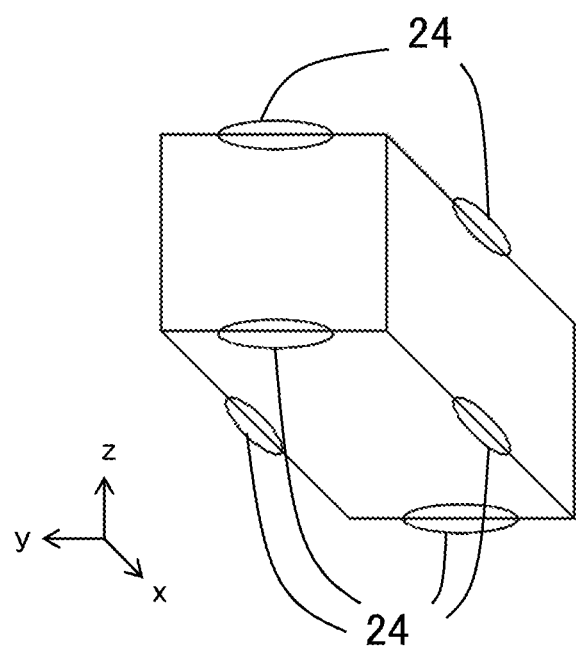
FIG. 28 is a perspective view schematically showing vibration nodes in a vibration mode in the conventional laminated ceramic capacitor.

Moreover, with use of the above-mentioned one-eighth scale model, a vibration mode of the evaluation component in an audio frequency range (the range of 20 Hz to 20 kHz) was determined by calculation using the thereby obtained parameters. The result of calculation at 10 kHz is shown in FIG. 26. FIG. 27(a) is a view of the one-eighth scale model as seen from the inner side (from the plane of symmetry) thereof, and FIG. 27(b) is a view of the one-eighth scale model as seen from the opposite side of the model from the side shown in FIG. 27(a), in other words, from the outer side (the surface) thereof. In the drawings, broken lines represent the shape of the evaluation component which is yet to be subjected to AC voltage application, and solid lines represent the shape of the evaluation component in a condition of undergoing maximum displacement under applied AC voltage. It will be understood from this result that, as shown in FIG. 28 which is a view schematically showing the evaluation component as a whole, on the paired faces opposed to each other in the stacking direction of the evaluation component, there is a region exhibiting low vibration amplitude, in other words, a region in the form of a node of vibration (hereafter referred to as "nodal region 24") located centrally of each side defining the face. Since the main body 1 according to this embodiment is equivalent to the evaluation component, it follows that such a nodal region 24 is present in the main body 1 in this embodiment as is the case with the evaluation component. It can thus be considered that, in the case where the main body 1 is secured, at the nodal regions 24, to the substrate 21, piezoelectric vibration of the main body 1 is restrained against propagation through the substrate 21, thus suppressing acoustic noise.

In this embodiment, the first joining member 4 and the second joining member 5 are each disposed on such a nodal region 24 present in the main body 1, wherefore the main body 1 can be secured to the substrate 21 at the nodal regions 24. Moreover, in the modified example 1 in which the first joining member 4 and the second joining member 5 are provided so as to lie on the first face 8 alone, when the laminated electronic component is joined to the substrate 21, it is possible to restrain the joining material (the first joining member 4 and the second joining member 5) from spreading over the substrate 21, and thereby attain greater packaging density in the laminated electronic component.

Acoustic noise simulation was made on the following models of the first embodiment and the modified example 1. In the first joining member 4 and the second joining member 5, L1 and L2 were each set at 310 μm, and P1 and P2 were each set at 142 μm. H1 and H2 in the first embodiment were each set at 78 μm. Moreover, C in the mounting structure was set at 140 μm. Otherwise, the conditions to be fulfilled by the main body 1 are identical to those adopted in the acoustic noise simulation made on the evaluation component as described above.

According to the result obtained by averaging the thereby obtained data throughout a frequency range of 5 Hz to 20 kHz, a 13 dBA reduction in the mean of sound pressure level was achieved in the present embodiment, and also a 15 dBA reduction was achieved in the modified example 1, as contrasted to the above-described evaluation component, viz., the conventional mounting structure.

Although the ratio of L1, L2 (310 μm) to E1, E2 (620 μm) (L1/E1, L2/E2) stood at 0.5 in the above-described simulation on the present embodiment, even when the ratio is 0.8, an about 10 dBA reduction in sound pressure level can be achieved as contrasted to the conventional case. Moreover, from mountability standpoint, it is preferable that L1/E1 and L2/E2 are greater than or equal to 0.4.

Moreover, the result of vibration mode analysis made on the evaluation component has showed that the center and a vicinal area of each face constituting the evaluation component, as well as the midpoint and a vicinal part of each side establishing contact between side faces, exhibit great vibration amplitude. It is thus preferable that neither the first joining member 4 nor the second joining member 5 is disposed near the center of each face of the main body 1, as well as near the midpoint of each side establishing contact between side faces. Specifically, it is preferable that the ratio of H1 to H0 (H1/H0) and the ratio of H2 to H0 (H2/H0) are each less than or equal to 0.4. Moreover, it is preferable that the ratio of P1, P2 to E3 (P1/E3, P2/E3) is less than or equal to 0.25.

The following describes, as mentioned previously, the range of each of the regions that are adjacent to the first side 11, the second side 12, and the third side 13, respectively, on the first face 8 in this embodiment. The region adjacent to the first side 11 corresponds to a region extending by a length which is less than or equal to 0.25 times E3 from the first side 11. Likewise, the region adjacent to the second side 12 corresponds to a region extending by a length which is less than or equal to 0.25 times E3 from the second side 12. The region adjacent to the third side 13 corresponds to a region extending by a length which is less than 0.1 times E1 or E2 from the third side 13. The first joining member 4 and the second joining member 5 are disposed within the range of the region adjacent to the first side 11 and the range of the region adjacent to the second side 12, respectively, but without the region adjacent to the third side 13. Thus, in this embodiment, neither the first joining member 4 nor the second joining member 5 is located centrally of the first face 8 of the main body 1.

In the mounting structure according to this embodiment, the main body 1 is not kept in direct contact with the mounting face of the substrate 21. It is particularly preferable that the ratio of the distance C between the main body 1 and the mounting face of the substrate 21 to H0 (C/H0) is greater than or equal to 0.1.

Moreover, although the mounting structure according to this embodiment has been illustrated as a structure constructed by mounting, on the substrate 21, the laminated electronic component comprising the main body 1 and the first and second joining members 4 and 5 attached to the main body 1, a structure comprising the main body 1 having neither the first joining member 4 nor the second joining member 5 may be defined as the mounting structure in the present embodiment so long as the main body 1 mounted on the substrate 21 is joined, at its areas where the first joining member 4 and the second joining member 5 are to be placed, to the substrate 21. In this case, the conductive layer 23 such as solder for joining the main body 1 to the substrate 21 corresponds to each of the first joining member 4 and the second joining member 5.

The invention is especially desirable for use in the case where the main body 1 is constructed of a laminated ceramic capacitor comprising dielectric layers made of a material having ferroelectricity such for example as barium titanate, and internal electrode layers made of a metal material such as Ni, Cu, Ag, or a Ag—Pd alloy. Even if another laminated electronic component is used as the main body 1, the embodiment is applicable to cases where there is a need to suppress excitation, which is induced by piezoelectric vibration of the laminated electronic component in itself, in, for example, the substrate 21 bearing the laminated electronic component in an audio frequency range. The invention is especially advantageous and affords remarkable effects when applied to a laminated electronic component of Type 1005 or larger.

As described heretofore, the main body 1 according to this embodiment is essentially equal in form to the conventional laminated electronic component, wherefore substantial design changes are not necessary. Thus, the present embodiment is applicable to a variety of existing laminated electronic components. Another advantage is that the present embodiment does not necessitate a specially prepared jig for its installation on the substrate.

Although the above description as to the present embodiment deals with, as an example of the main body 1, a typically structured laminated ceramic capacitor having external electrodes 3 disposed one at each end thereof in its lengthwise direction, other laminated electronic components of various structures, for example, a low-profile type, a so-called LW reverse type, or a multiple terminal type may be applied to the main body 1. In the case of applying a LW reverse-type component, a multiple-terminal type component, etc. to the main body 1, as will hereafter be described, it is desirable to use the first joining member 4 and the second joining member 5 each having insulation capability.

Moreover, although, as the external electrode 3, for example, one composed of a Cu-made base electrode plated with Ni and Sn is used in many laminated ceramic capacitors, the present embodiment is applicable to a component having the external electrode 3 composed solely of a plating electrode without using a base electrode. In the case where the external electrode 3 comprising the base electrode is joined directly to the land pattern 22 of the substrate 21 via solder or the like, since the Cu-made base electrode is relatively soft, it follows that piezoelectric vibration of the stacked body 2 is absorbed to a certain extent by the base electrode and is thus attenuated. This helps suppress acoustic noise. On the other hand, in the case where the external electrode 3 is composed solely of a plating electrode, piezoelectric vibration of the stacked body 2 is not attenuated by the external electrode 3, causing appreciable acoustic noise. Accordingly, the application of the present embodiment to a component having the external electrode 3 composed solely of a plating electrode makes it possible to attain even higher acoustic noise suppression effect.

Moreover, while Sn plating on the external electrode 3 is conducive to enhancement in wettability between the external electrode 3 and solder when mounting the laminated electronic component on the substrate 21, in this embodiment, the main body 1 is joined to the land pattern 22 of the substrate 21 via the first joining member 4 and the second joining member 5, wherefore an electrode free of Sn plating may be used as the external electrode 3. Moreover, following the formation of the first joining member 4 and the second joining member 5, a part of the external electrode 3 which is left exposed may be treated so as to be less wettable to solder by, for example, formation of an oxide film on that exposed part.

In the laminated electronic component according to this embodiment, the first joining member 4 and the second joining member 5 may be disposed not only on the first-face 8 side of the main body 1 but also on the second-face 9 side thereof opposite the first-face 8 side. In other words, given that both of the paired first and second faces 8 and 9 opposed to each other in the stacking direction are defined by the first side 11, the second side 12, and the third sides 13, the main body 1 may be provided with a plurality of the first joining members 4 and a plurality of the second joining members 5.

Moreover, either one or both of the first joining member 4 and the second joining member 5 may be designed to have insulation capability. In this case, the external electrode 3 is electrically connected to an electric circuit of the substrate 21 by wire bonding or otherwise. As an insulating material, thermoplastic resin such for example as ethylene vinyl acetate (EVA) or polypropylene (PP) is desirable for use.

Second Embodiment

Figure 6:
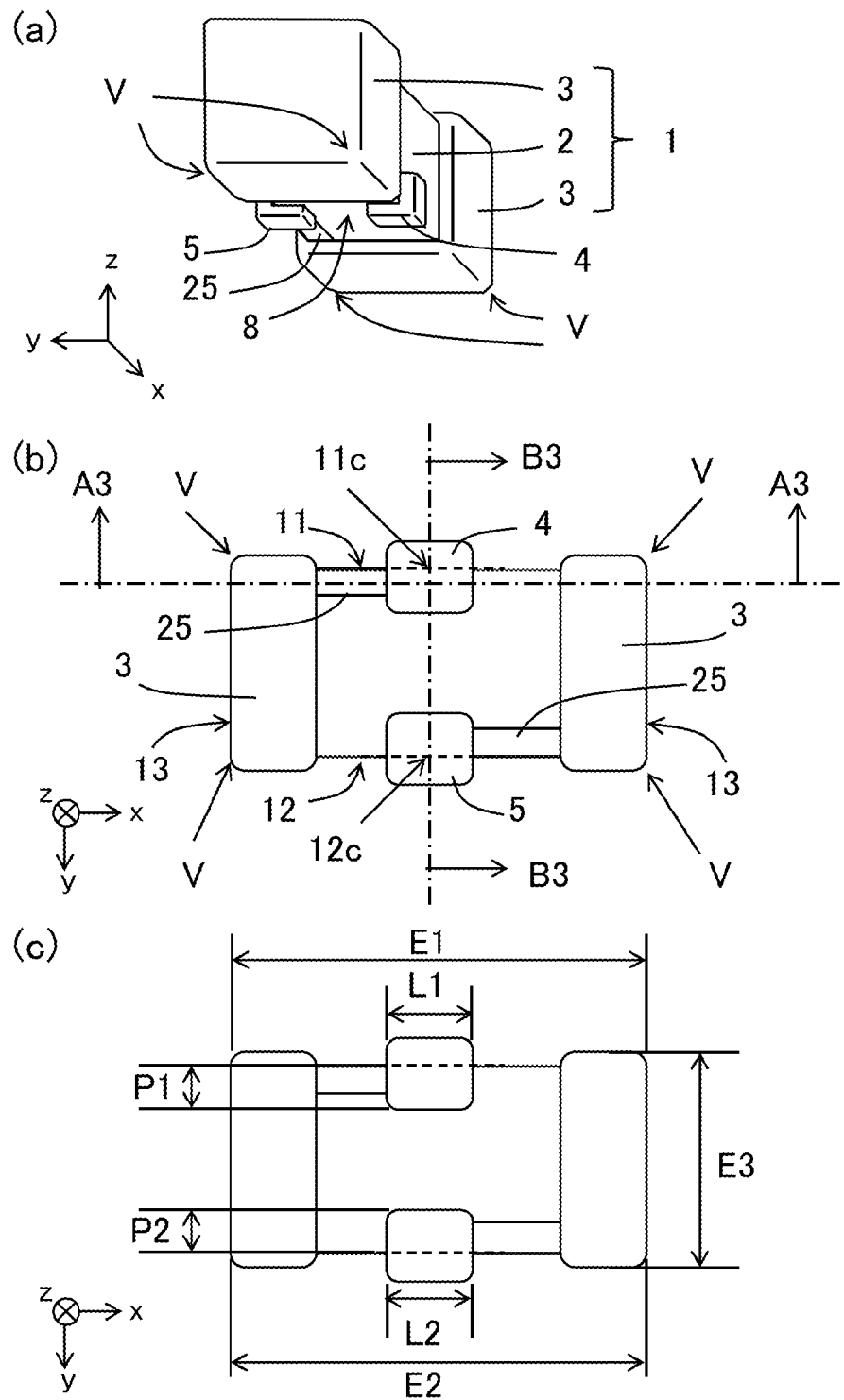
FIG. 6 is a view showing a laminated electronic component according to a second embodiment, and more specifically
Figure 7:
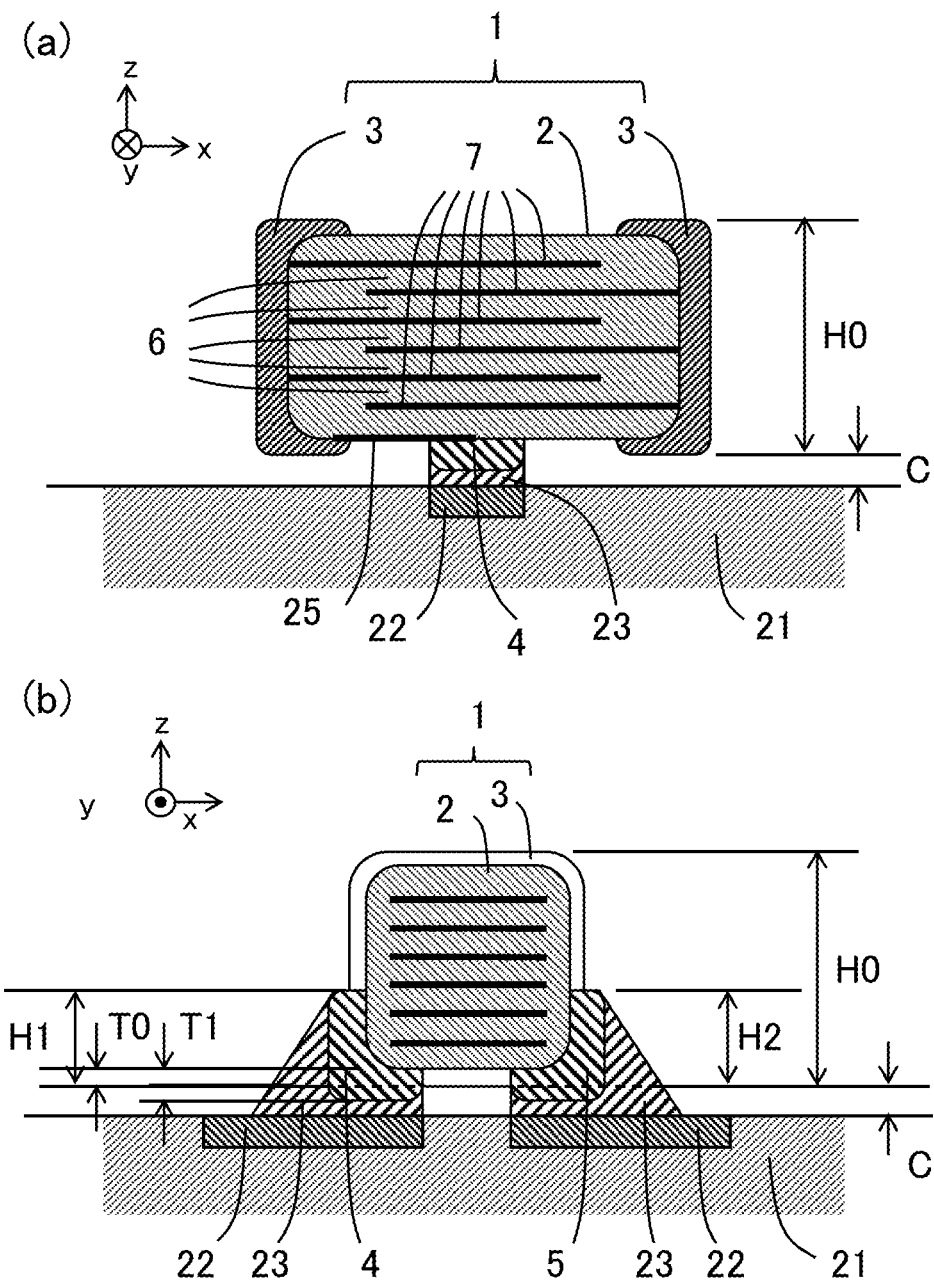
FIG. 7 is a sectional view showing a mounting structure, which is constructed by mounting the laminated electronic component according to the second embodiment on a substrate, and more specifically

In a second embodiment, like the first embodiment, the first joining member 4 and the second joining member 5 are located on the first face 8 side of the main body 1. As shown in FIG. 6(c), the second embodiment differs from the first embodiment in that the length E1 of the first side 11 bearing the first joining member 4, the length E2 of the second side 12 bearing the second joining member 5, and the length E3 of the third side 13 free of the joining member fulfill the following relational expressions: E3<E1; and E3<E2. In FIG. 7, there is shown the laminated electronic component in this embodiment mounted on the substrate 21, and more specifically FIG. 7(a) is a sectional view of the laminated electronic component taken along the line A3-A3 shown in FIG. 6(b), and FIG. 7(b) is a sectional view of the laminated electronic component taken along the line B3-B3 shown in FIG. 6(b).

Moreover, the first joining member 4 and the second joining member 5 are each formed on the surface of the stacked body 2 so as to be spaced away from the external electrode 3, and, each of the first joining member 4 and the second joining member 5 has electrical conductivity. The surface of the stacked body 2 is further provided with a pair of electric conductors 25, and, one of the electric conductors 25 provides electrical connection between the first joining member 4 and one of the external electrodes 3, and, the other one of the electric conductors 25 provides electrical connection between the second joining member 5 and the other one of the external electrodes 3. For example, the electric conductor 25 is formed by plating, or formed from an electrically conductive paste.

As materials for forming the first joining member 4 and the second joining member 5, as is the case with the first embodiment, use can be made of, for example, a brazing material such as eutectic solder and lead-free solder (Sn—Ag—Cu solder), and a conductive adhesive.

Modified Example

Figure 8:
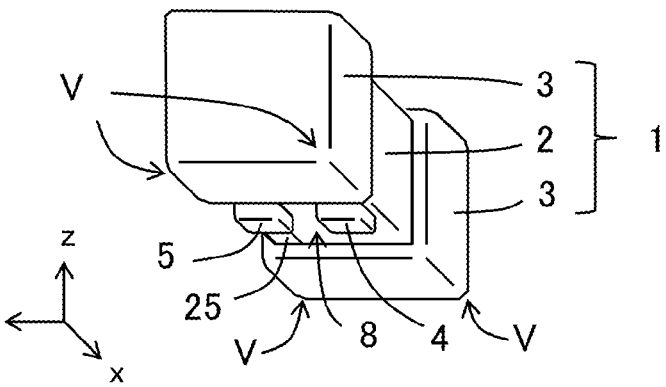
FIG. 8 is a view showing a modified example of the laminated electronic component according to the second embodiment, and more specifically
Figure 8:
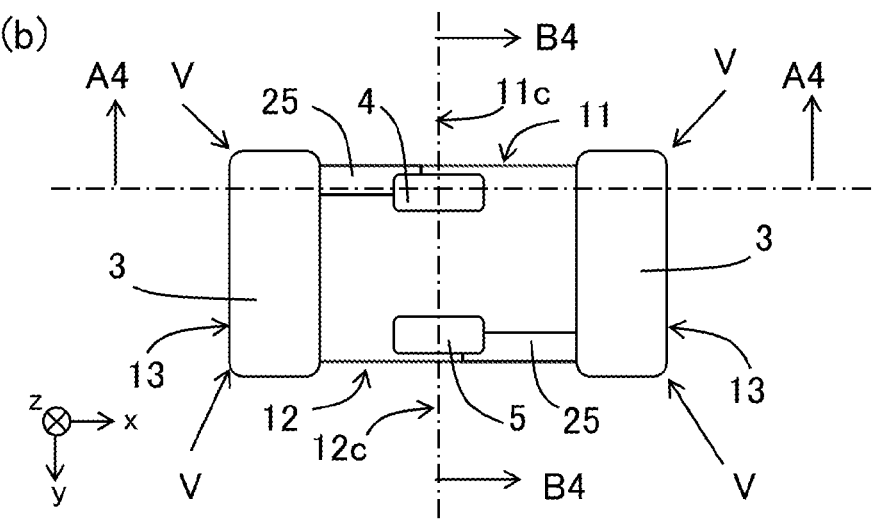
Figure 8:
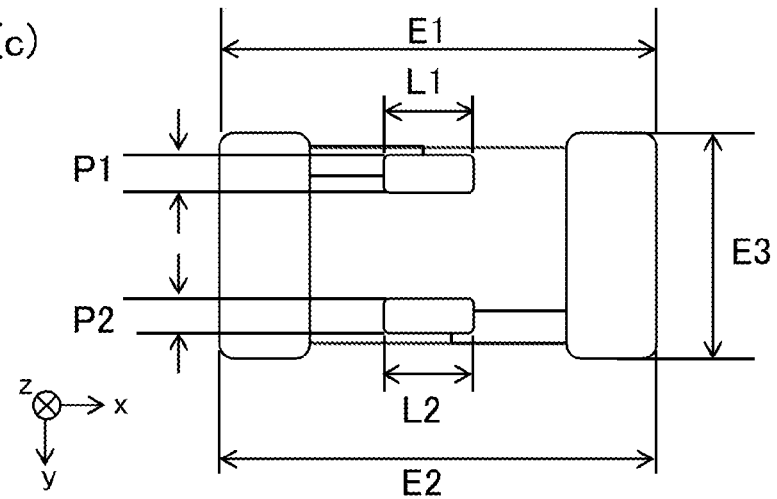

In FIG. 8, there is shown a modified example of the second embodiment (modified example 2). In this construction, the first joining member 4 and the second joining member 5 are spaced away from the first side 11 and the second side 12, respectively, so as to lie only on the first face 8. FIG. 8(b) is a plan view of the laminated electronic component in the modified example 2 as seen from the first face 8.

Figure 9:
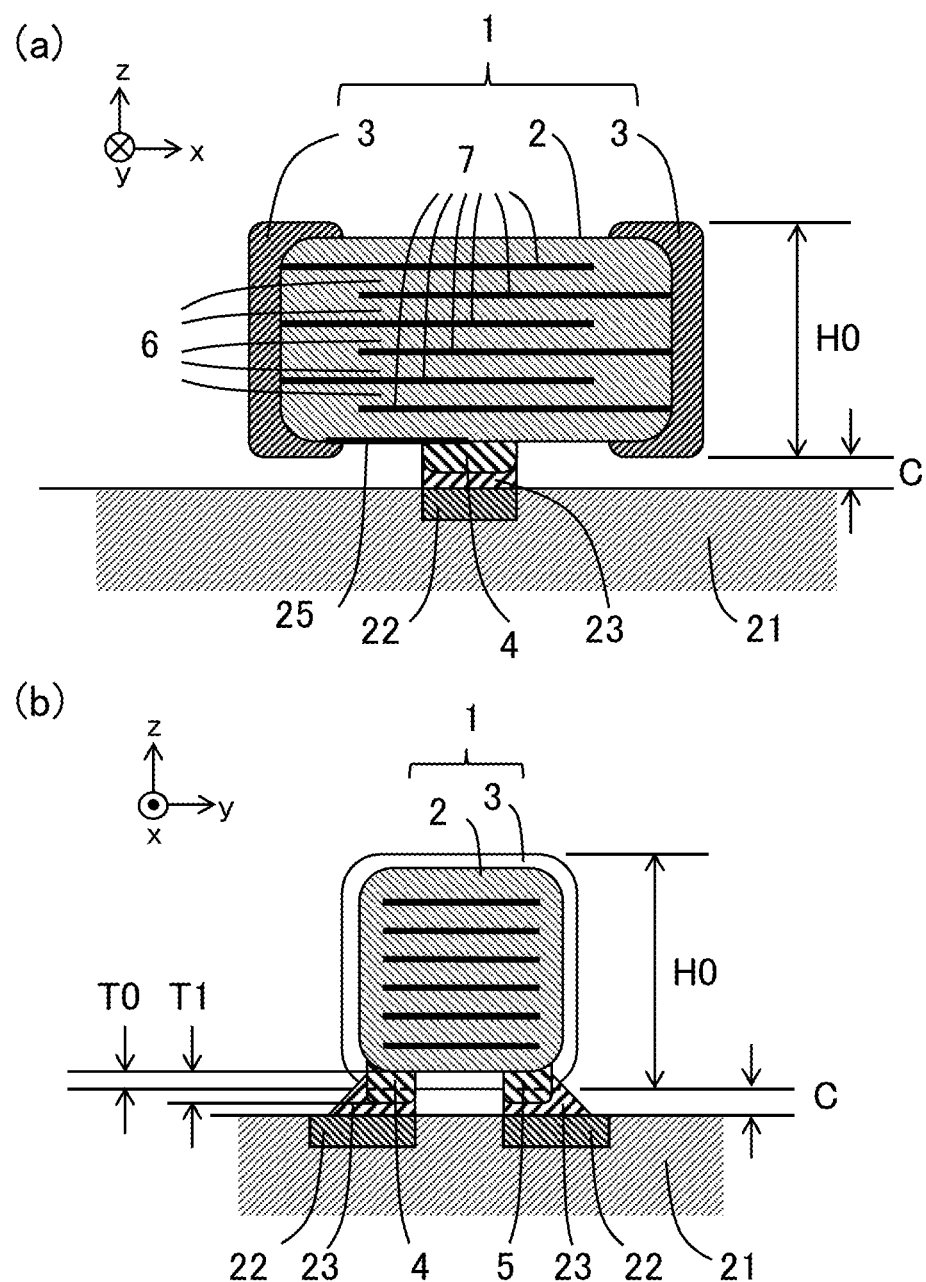
FIG. 9 is a sectional view of a mounting structure, which is constructed by mounting the modified example of the laminated electronic component according to the second embodiment on the substrate, and more specifically

In FIG. 9, there is shown the laminated electronic component in the modified example 2 mounted on the substrate 21, and more specifically FIG. 9(a) is a sectional view of the laminated electronic component taken along the line A4-A4 shown in FIG. 8(b), and FIG. 9(b) is a sectional view of the laminated electronic component taken along the line B4-B4 shown in FIG. 8(b).

Although the first joining member 4 and the second joining member 5 are spaced away from the first side 11 and the second side 12, respectively, in FIGS. 8 and 9, the first joining member 4 and the second joining member 5 may be placed in contact with the first side 11 and the second side 12, respectively.

In a laminated electronic component mounting structure in this embodiment, like the first embodiment, as shown in FIG. 7, the main body 1 is joined to the land pattern 22 on the substrate 21 via the first joining member 4 and the second joining member 5, and, the first face 8 and the mounting face of the substrate 21 are opposed to each other. Also in this embodiment, the first joining member 4 and the second joining member 5 serve to join the main body 1 to the substrate 21, as well as to provide electrical connection between the external electrode 3 of the main body 1 and a circuit (not shown) of the substrate 21.

Acoustic noise simulation was made on the following models of the second embodiment and the modified example thereof. In the first joining member 4 and the second joining member 5, L1 and L2 were each set at 220 μm, and P1 and P2 were each set at 142 μm. H1 and H2 in the second embodiment were each set at 78 μm. Moreover, C in the mounting structure in this embodiment was set at 140 μm. Otherwise, the conditions to be fulfilled by the main body 1 are identical to those adopted in the acoustic noise simulation made on the evaluation component as described above.

According to the result obtained by averaging the thereby obtained data throughout a frequency range of 5 Hz to 20 kHz, a 20 dBA reduction in the mean of sound pressure level was achieved in the second embodiment, and also a 22 dBA reduction was achieved in the modified example 2, as contrasted to the conventional mounting structure.

The acoustic noise suppression effect of this embodiment has been found to be greater than that obtained in the simulation made on the first embodiment. This is presumably because, since the distance between the first joining member 4 and the second joining member 5 in this embodiment is shorter than that in the first embodiment, it follows that the difference in vibratory displacement between the areas of the main body 1 provided with the first joining member 4 and the second joining member 5, respectively, in this embodiment is smaller than that in the first embodiment, and consequently this embodiment is higher than the first embodiment in the capability of restraining the propagation of piezoelectric vibration of the main body 1 through the substrate 21.

Although the ratio of L1, L2 (220 µm) to E1, E2 (1100 µm) (L1/E1, L2/E2) stood at 0.2 in this simulation, even when the ratio is 0.5, an about 10 dBA reduction in sound pressure level can be achieved as contrasted to the conventional case. Moreover, the smaller is the values of L1/E1 and L2/E2, the likelier it becomes that the main body 1 is inclined with respect to the substrate 21 during mounting operation. In this regard, and also, from mountability standpoint, L1/E1 and L2/E2 preferably falls in the range of 0.1 to 0.5, or more preferably in the range of 0.4 to 0.5.

Moreover, a point of importance in this embodiment is a thickness T1 of the first joining member 4 and the second joining member 5 at the first face 8. The external electrode 3 extends outwardly of the stacked body 2 beyond each face constituting the stacked body 2 under normal conditions. It is thus preferable that, at the first face 8, the thickness T1 of the first joining member 4 and the second joining member 5 is greater than a thickness T0 of the outwardly-extending part of the external electrode 3. This makes it possible to avoid contact between the external electrode 3 of the main body 1 and the mounting face of the substrate 21 when mounting the laminated electronic component on the substrate 21, and thereby restrain piezoelectric vibration of the main body 1 from propagating through the substrate 21 via the external electrode 3 more reliably.

It is preferable that the values of H1, H2, P1, P2, and C are similar to those determined in the first embodiment.

In this embodiment, the first joining member 4 and the second joining member 5 are each formed on the surface of the stacked body 2 so as to be spaced away from both of the external electrodes 3, and are electrically connected to different external electrodes 3 by the corresponding electric conductors 25. As an alternative, the first joining member 4 and the second joining member 5 are connected directly to different external electrodes 3. In this case, each joining member is spaced away from only one of the external electrodes 3.

Third Embodiment

Figure 10:
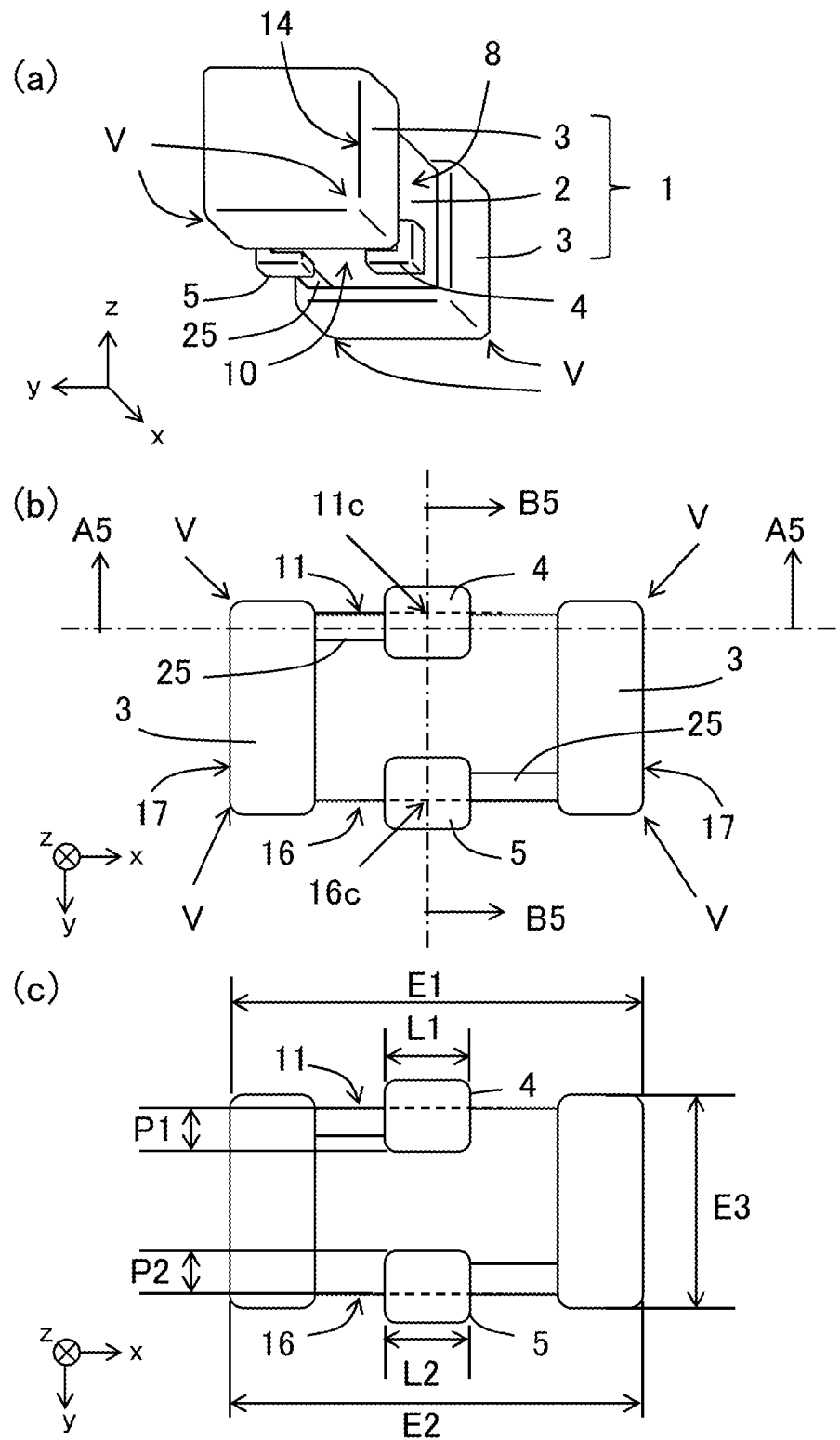
FIG. 10 is a view showing a laminated electronic component according to a third embodiment, and more specifically
Figure 11:
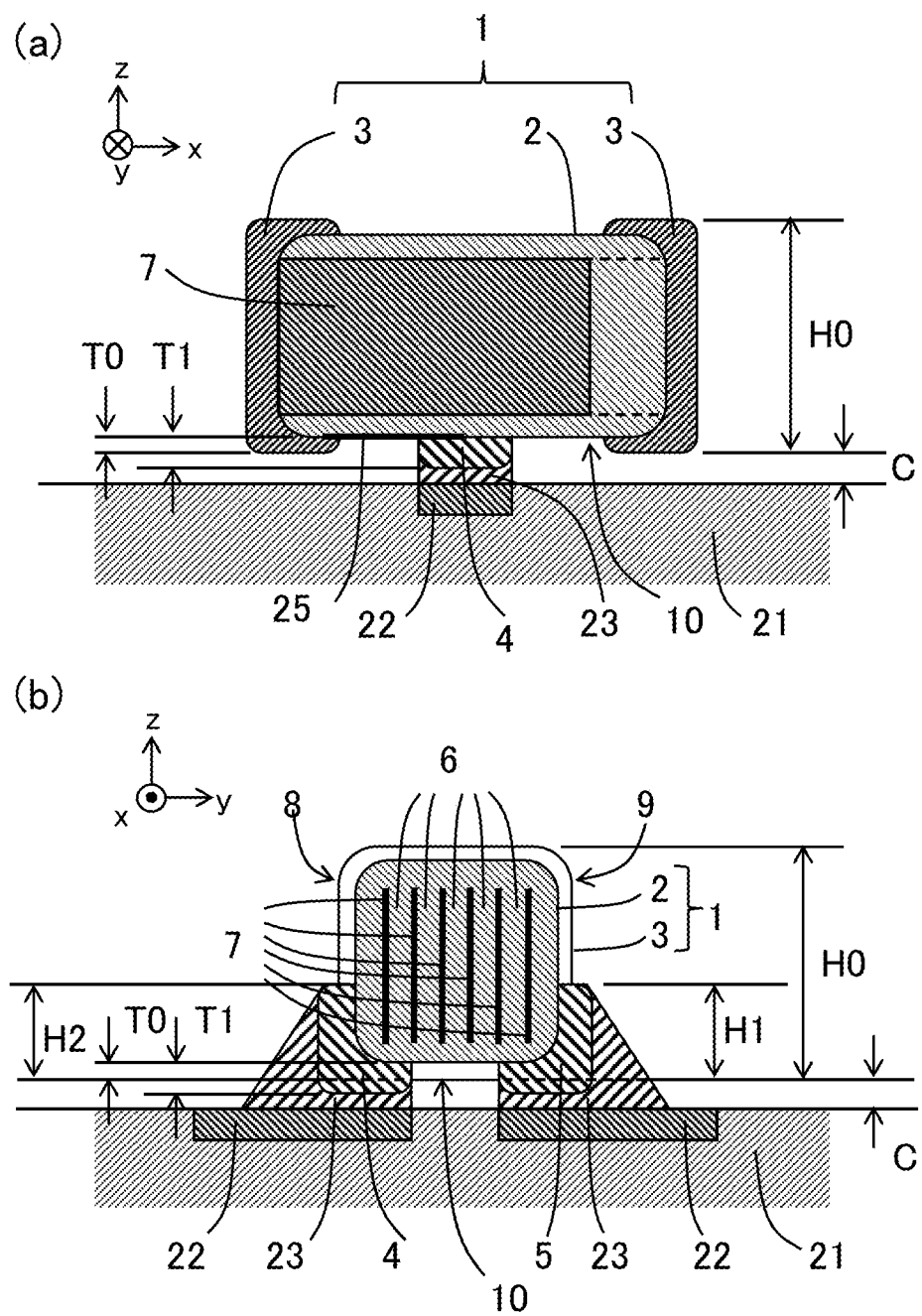
FIG. 11 is a sectional view showing a mounting structure, which is constructed by mounting the laminated electronic component according to the third embodiment on a substrate, and more specifically

The following describes a third embodiment. Like the first embodiment, a laminated electronic component according to the third embodiment comprises a main body 1 shaped in a rectangular prism, and has, as shown in FIGS. 10 and 11, a pair of a first side face 10 and a second side face (not shown) opposed to each other in a direction perpendicular to the stacking direction of the dielectric layers 6 and the internal electrode layers 7. The sides defining the first side face 10 include a first side 11, a second side 16 opposed to the first side 11, and a pair of third sides 17 contiguous to the first side 11 and the second side 16.

The first joining member 4 and the second joining member 5 are disposed on a part of the first side face 10 which has the first side 11 as a constituent part and a part of the first side face 10 which has the second side 16 as a constituent part, respectively. The first side 11 is a side establishing contact between the first side face 10 and the first face 8, the second side 16 is a side establishing contact between the first side face 10 and the second face 9, and the third side 17 is a side establishing contact between the first side face 10 and other side face. Moreover, in the third embodiment, a side of the first face 8 which is contiguous to the first side 11 will be referred to as a fourth side 14. Note that a side of the second face 9 which is contiguous to the second side 16 may also be referred to as a fourth side 14.

In such a laminated electronic component, as shown in FIG. 11, the main body 1 is joined to the land pattern 22 on the substrate 21 via the first joining member 4 and the second joining member 5, and, the first side face 10 and the mounting face of the substrate 21 are opposed to each other. In FIG. 11, there is shown the laminated electronic component according to the third embodiment mounted on the substrate 21, and more specifically FIG. 11(a) is a sectional view of the laminated electronic component taken along the line A5-A5 shown in FIG. 10(b), and FIG. 11(b) is a sectional view of the laminated electronic component taken along the line B5-B5 shown in FIG. 10(b). In FIG. 11, the stacking direction coincides with the y-axis direction in the coordinates.

The third embodiment is similar to other embodiments in E1, L1, L2, and C, but differs from them in the definitions of E2, E3, P1, P2, H0, H1, and H2. That is, in the third embodiment, as shown in FIG. 10 (c), E2 represents the length of the second side 16, E3 represents the length of the third side 17, and P1 represents the length of a part of the first joining member 4 on the first side face 10 which extends from the first side 11 toward the center of the first side face 10 in a direction perpendicular to the first side 11. P2 represents the length of a part of the second joining member 5 on the first side face 10 which extends from the second side 16 toward the center of the first side face 10 in a direction perpendicular to the second side 16. Moreover, as shown in FIG. 11, H0 represents the length of the fourth side 14, expressed differently, the height of the main body 1 in the z-axis direction in the coordinates. H1 represents the length, in the z-axis direction, of a part of the first joining member 4 which lies on the first face 8 contiguous to the first side face 10, and H2 represents the length, in the z-axis direction, of a part of the second joining member 5 which lies on the second face 9 contiguous to the first side face 10.

Acoustic noise simulation was made on the following model of the third embodiment. In the first joining member 4 and the second joining member 5, L1 and L2 were each set at 200 µm, H1 and H2 were each set at 78 µm, and P1 and P2 were each set at 140 µm. Moreover, C in the mounting structure in the third embodiment was set at 140 µm. Otherwise, the conditions to be fulfilled by the main body 1 are identical to those adopted in the acoustic noise simulation made on the evaluation component as described above.

According to the result obtained by averaging the thereby obtained data throughout a frequency range of 5 Hz to 20 kHz, a 20 dBA reduction in the mean of sound pressure level was achieved in the third embodiment as contrasted to the conventional mounting structure.

Although the ratio of L1, L2 (200 µm) to E1, E2 (1100 µm) (L1/E1, L2/E2) stood at 0.18 in this simulation, even when the ratio is 0.5, a 10 dBA reduction in sound pressure level can be achieved as contrasted to the conventional case.

In the third embodiment, the electric conductor 25 is placed on an area capable of bearing the first joining member 4 and the second joining member 5.

Laminated electronic components to which the third embodiment is applicable are similar in form and material to those to which other embodiments are applicable, and further description thereof will thus be omitted. Moreover, also in the third embodiment, like the first embodiment, the first joining member 4 and the second joining member 5 may be disposed not only on the first side face 10 of the main body 1 but also on the second side face thereof opposite the first side face 10.

Moreover, either one or both of the first joining member 4 and the second joining member 5 may be designed to have insulation capability. In this case, the external electrode 3 is electrically connected to an electric circuit of the substrate by wire bonding or otherwise.

Fourth Embodiment

Figure 12:
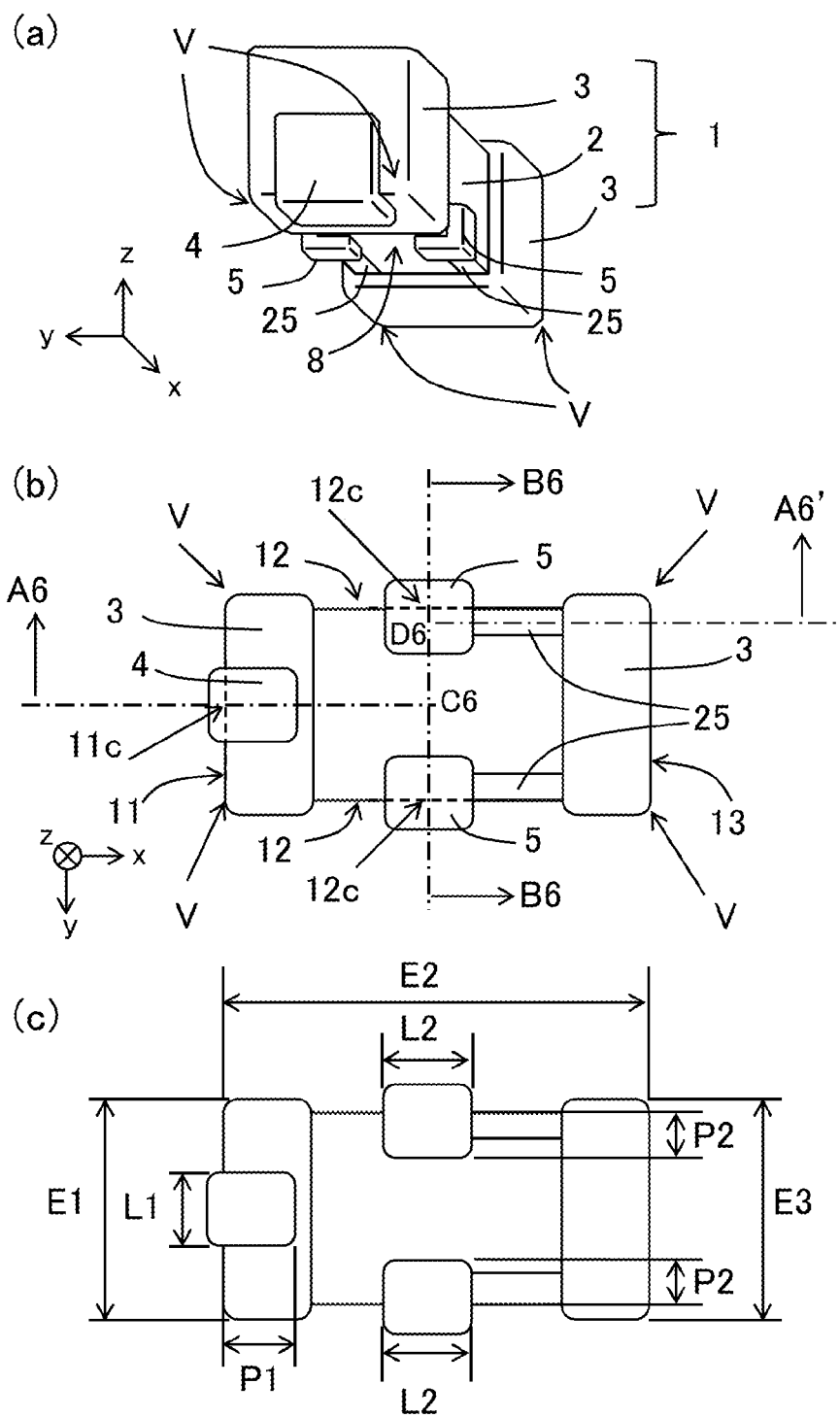
FIG. 12 is a view showing a laminated electronic component according to a forth embodiment, and more specifically
Figure 13:
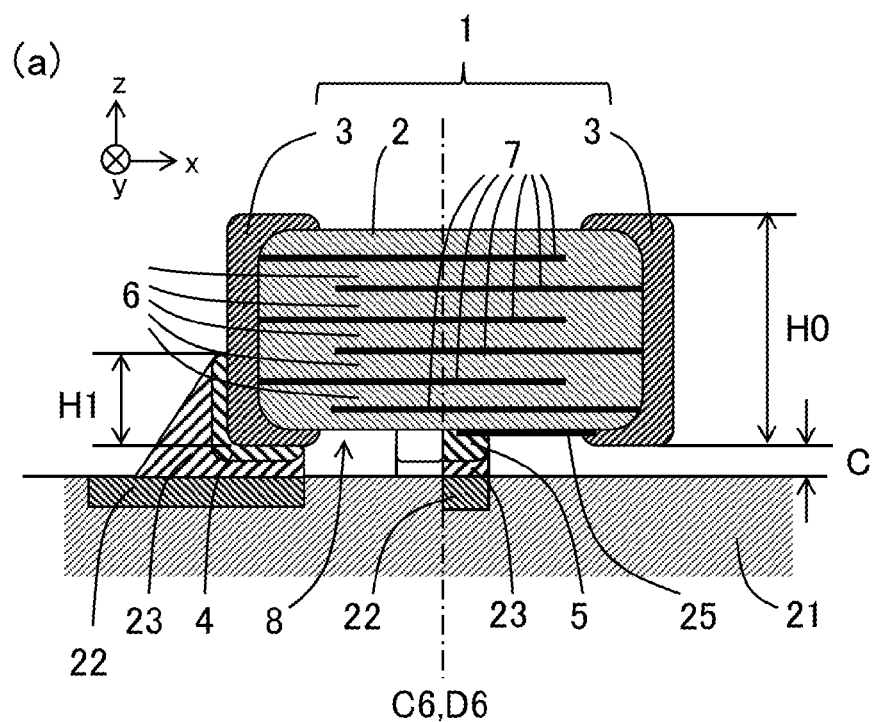
FIG. 13 is a sectional view showing a mounting structure, which is constructed by mounting the laminated electronic component according to a fourth embodiment on a substrate, and more specifically
Figure 13:
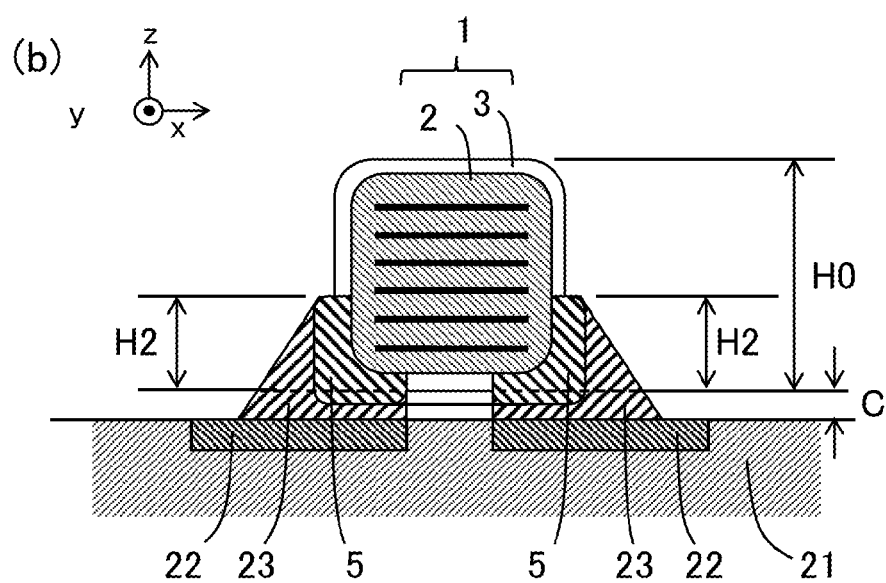

In a fourth embodiment, as shown in FIG. 12, like the first and second embodiments, the first joining member 4 and the second joining member 5 are located on the first face 8 side of the main body 1. As shown in FIG. 12, the fourth embodiment differs from the first and second embodiments in that a pair of opposed second sides 12 contiguous to the first side 11 is provided, and, the paired second sides 12 are each provided with the second joining member 5, and a pair of the second joining members 5 are located in the positions of the paired second sides 12 opposed to each other. In this embodiment, As shown in FIG. 12 (c), the length E1 of the first side 11, the length E2 of the second side 12, and the length E3 of the third side 13 fulfill the following relational expressions: E1<E2; and E3<E2. In FIG. 13, there is shown the laminated electronic component in this embodiment mounted on the substrate 21, and more specifically FIG. 13(a) is a sectional view of the laminated electronic component taken along the line A6-C6-D6-A6' shown in FIG. 12(b), and FIG. 13(b) is a sectional view of the laminated electronic component taken along the line B6-B6 shown in FIG. 12(b).

The first joining member 4 is formed on a surface of a part of the external electrode 3 located on the first side 11 side. The paired second joining members 5 are each formed on a surface of the stacked body 2 so as to be spaced away from the external electrode 3. Each of the first joining member 4 and the second joining members 5 has electrical conductivity. The paired second joining members 5 are each electrically connected to the external electrode 3 located on the third side 13 side by the electric conductor 25. For example, the electric conductor 25 is formed by plating, or formed from an electrically conductive paste.

As materials for forming the first joining member 4 and the second joining member 5, as is the case with the first and second embodiments, use can be made of, for example, a brazing material such as eutectic solder and lead-free solder (Sn—Ag—Cu solder), and a conductive adhesive.

Modified Example

Figure 14:
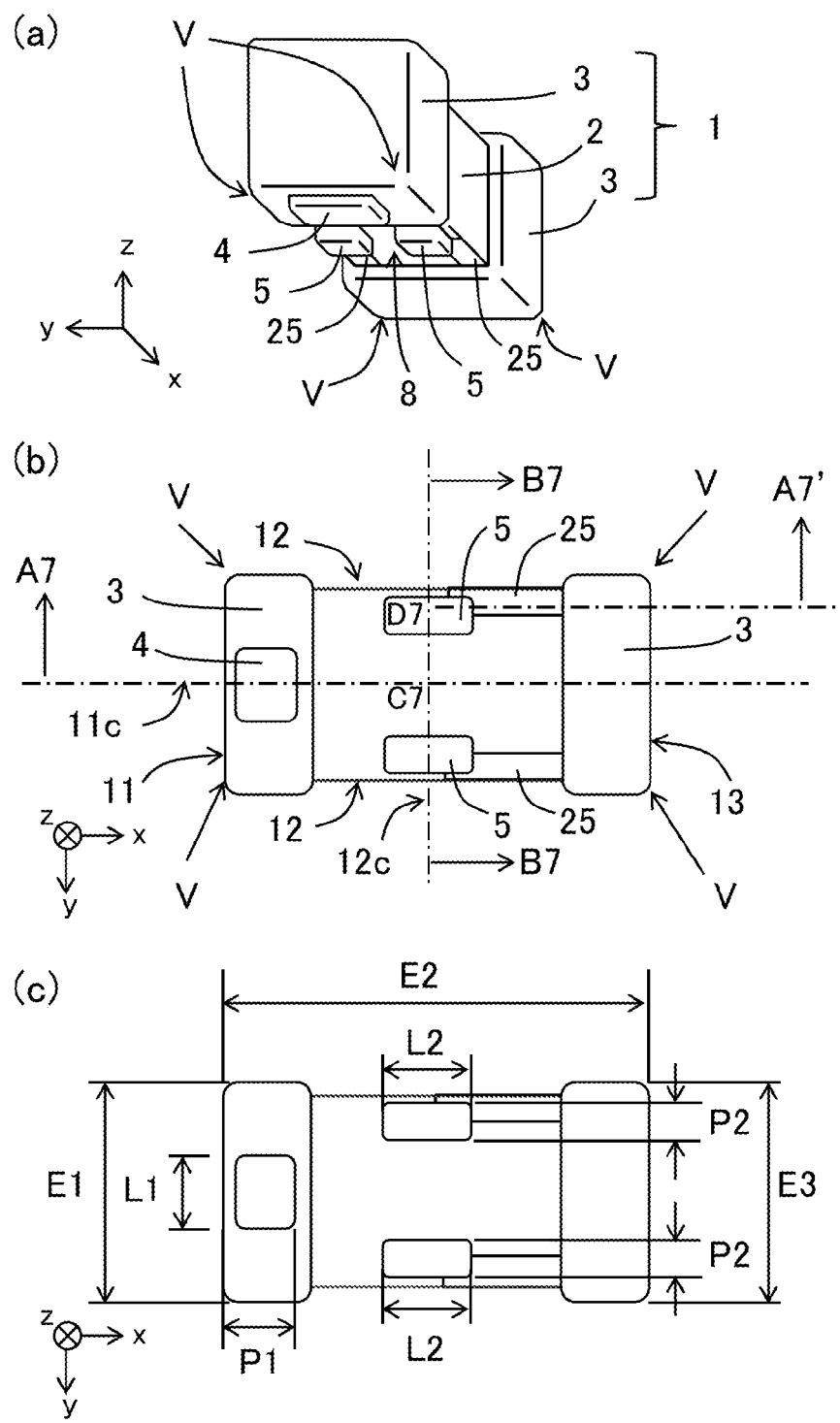
FIG. 14 is a view showing a modified example of the laminated electronic component according to the fourth embodiment, and more specifically

In FIG. 14, there is shown a modified example of the fourth embodiment (modified example 4). In this construction, the first joining member 4 and the second joining member 5 are spaced away from the first side 11 and the second side 12, respectively, so as to lie only on the first face 8. FIG. 14(b) is a plan view of the laminated electronic component according to this embodiment as seen from the first principal face 8.

Figure 15:
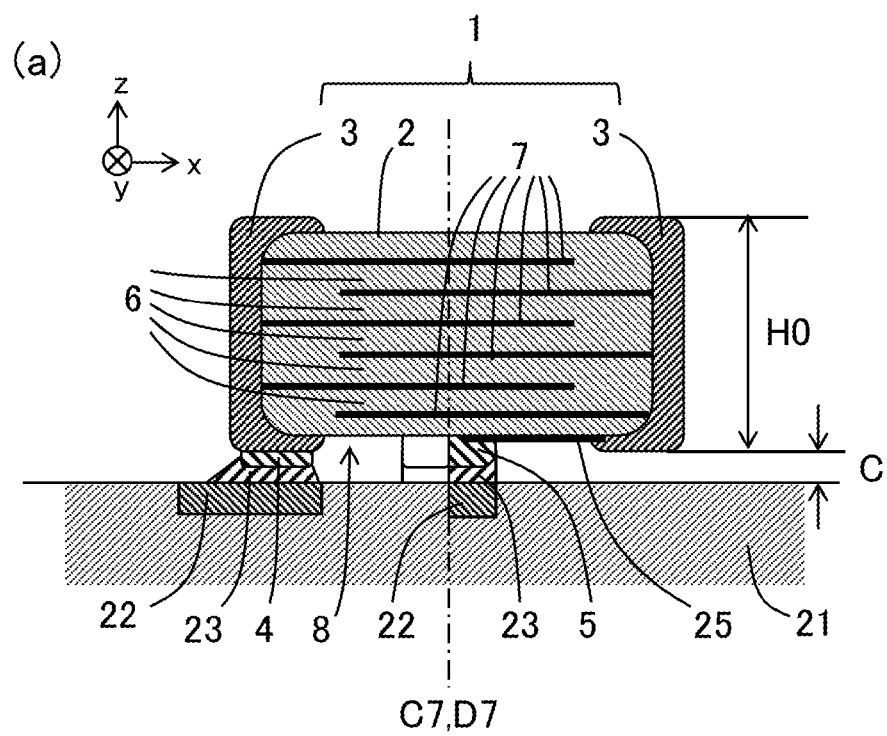
FIG. 15 is a sectional view of a mounting structure, which is constructed by mounting the modified example of the laminated electronic component according to the fourth embodiment on the substrate, and more specifically
Figure 15:
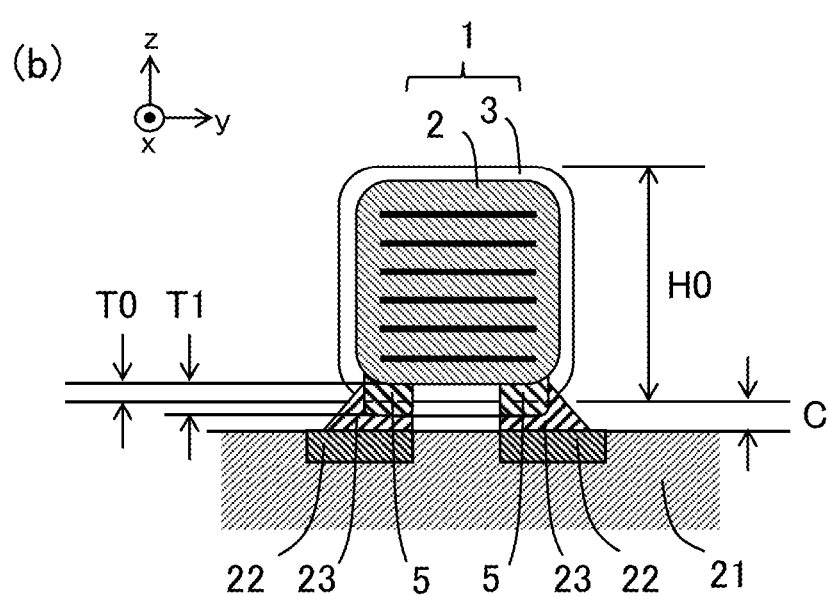

In FIG. 15, there is shown the laminated electronic component in the modified example 4 mounted on the substrate 21, and more specifically FIG. 15(a) is a sectional view of the laminated electronic component taken along the line A7-C7-D7-A7' shown in FIG. 14(b), and FIG. 15(b) is a sectional view of the laminated electronic component taken along the line B7-B7 shown in FIG. 15(b).

Although the first joining member 4 and the second joining member 5 are spaced away from the first side 11 and the second side 12, respectively, in FIGS. 14 and 15, the first joining member 4 and the second joining member 5 may be placed in contact with the first side 11 and the second side 12, respectively.

In a laminated electronic component mounting structure according to this embodiment, as shown in FIG. 13, the main body 1 is joined to the land pattern 22 on the substrate 21 via the first joining member 4 and the second joining member 5, and, the first face 8 and the mounting face of the substrate 21 are opposed to each other. Also in this embodiment, the first joining member 4 and the second joining member 5 serve to join the main body 1 to the substrate 21, as well as to provide electrical connection between the external electrode 3 of the main body 1 and a circuit (not shown) of the substrate 21.

Acoustic noise simulation was made on the following models of the fourth embodiment and the modified example thereof. In the first joining member 4 and the second joining member 5, L1 and L2 were set at 310 μm and 142 μm, respectively, and P1 and P2 were each set at 142 μm. In the first joining member 4 of the fourth embodiment, H1 was set at 78 μm. Moreover, C in the mounting structure was set at 140 μm. Otherwise, the conditions to be fulfilled by the main body 1 are identical to those adopted in the acoustic noise simulation made on the evaluation component as described above.

According to the result obtained by averaging the thereby obtained data throughout a frequency range of 5 Hz to 20 kHz, a 24 dBA reduction in the mean of sound pressure level was achieved in the fourth embodiment, and also a 26 dBA reduction was achieved in the modified example thereof, as contrasted to the conventional mounting structure.

Although L1 was set at 310 μm and the ratio of L1 to E1 (620 μm) (L1/E1) stood at 0.5 in this simulation, even when the ratio is 0.8, an about 10 dBA reduction in sound pressure level can be achieved as contrasted to the conventional case. Moreover, from mountability standpoint, it is preferable that the value of L1/E1 is greater than or equal to 0.4. In addition, although L2 was set at 142 μm and the ratio of L2 to E2 (1100 μm) (L2/E2) stood at 0.13 in this simulation, even when the ratio is 0.2, an about 10 dBA reduction in sound pressure level can be achieved as contrasted to the conventional case.

It is preferable that the values of H1, H2, P1, P2, and C are similar to those determined in the first and second embodiments.

Moreover, in this embodiment, like the second embodiment, it is preferable that the thickness T1 of the second joining member 5 is greater than the height T0 of a part of the external electrode 3 which protrudes from the first principal face 8.

It is preferable that the values of H1, H2, and C are similar to those determined in the first and second embodiments.

In this embodiment, the paired second joining members 5 are formed on the surface of the stacked body 2 so as to be spaced away from the external electrodes 3, and, each second joining member 5 is electrically connected to the external electrode 3 located on the third side 13 side by the electric conductor 25. As an alternative, only one of the paired second joining members 5 is electrically connected to the external electrode 3 located on the third side 13 side, and the other is left electrically unconnected. In another alternative, the paired second joining members 5 are directly connected to the external electrode 3 located on the third side 13 side, and are thus spaced away from the external electrode 3 located on the first side 11 side.

Moreover, the first joining member 4 may be designed to serve only to secure the main body 1 to the substrate 21. In this case, the paired second joining members 5 are electrically connected to different external electrodes 3, so that the main body 1 is connected to the electric circuit of the substrate 21 via the paired second joining members 5 alone.

Laminated electronic components to which this embodiment is applicable are similar in form and material to those to which the first and second embodiments are applicable, and further description thereof will thus be omitted. Moreover, also in this embodiment, like the first and second embodiments, the first joining member 4 and the second joining member 5 may be disposed not only on the first-face 8 side of the main body 1 but also on the second-face 9 side thereof opposite the first-face 8 side.

Moreover, either one or both of the first joining member 4 and the second joining member 5 may be designed to have insulation capability. In this case, the external electrode 3 is electrically connected to the electric circuit of the substrate by wire bonding or otherwise.

Fifth Embodiment

Figure 16:
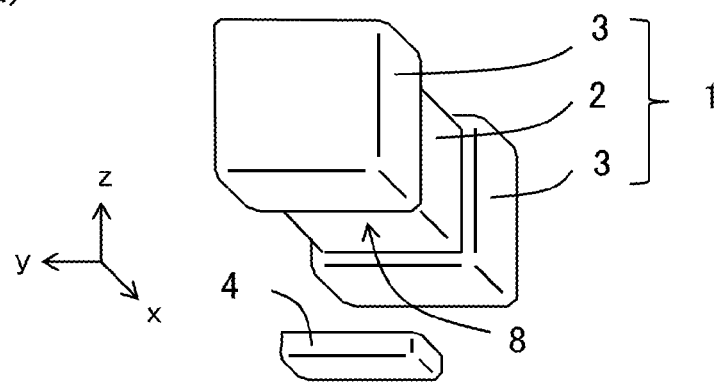
FIG. 16 is a view showing the laminated electronic component according to a fifth embodiment, and more specifically
Figure 16:
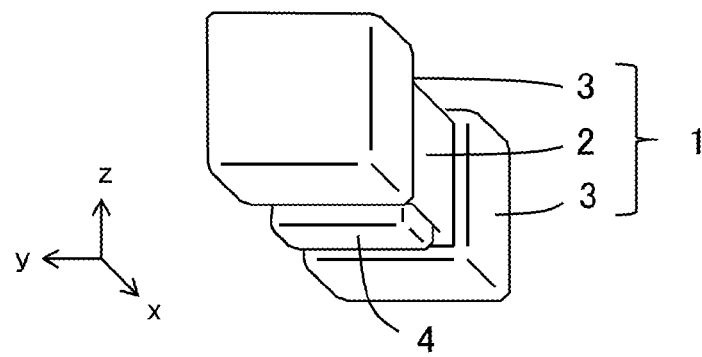
Figure 16:
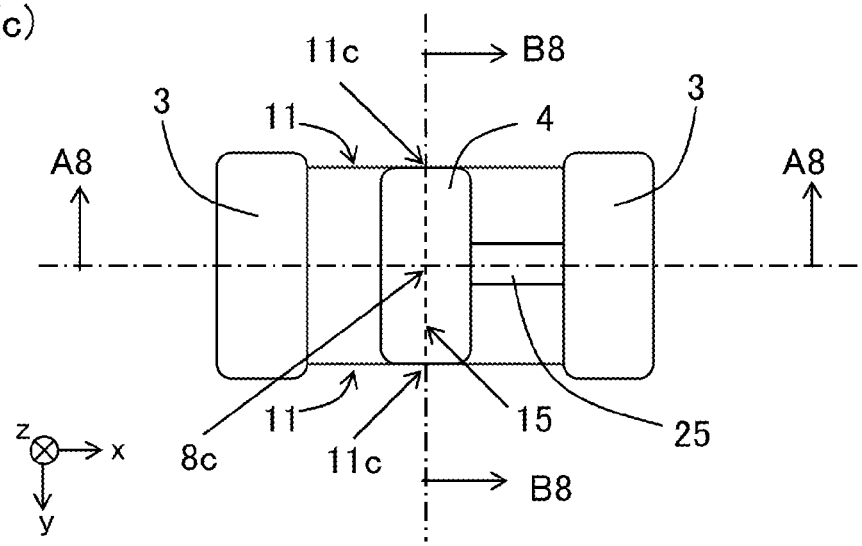

In a fifth embodiment, as shown in FIG. 16(c), the first joining member 4 alone is provided on the first face 8 side of the main body 1, the first joining member 4 is disposed in a region which lies on a line 15 connecting midpoints 11c of the opposed paired first sides 11, which are one of two pairs of opposed sides defining the first face 8, and contains a center 8c of the first face 8, in the form of an elongate member extending along the line 15. The midpoint 11c of the first side 11 corresponds to a bisection point in which the length of the first side 11 is bisected, and the center 8c of the first face 8 corresponds to the centroid of the plane of the first face 8.

Figure 17:
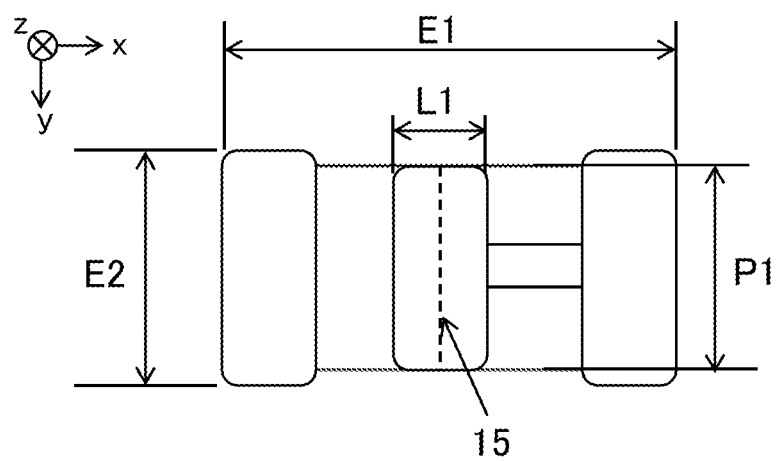
FIG. 17 is a plan view of the laminated electronic component according to the fifth embodiment as seen from the first face, illustrating the dimensions of constituent components.

In this embodiment, as shown in FIG. 17, given that the length of the first side 11 is E1 and the length of the side in the other pair contiguous to the first side at the first face 8 of the main body 1 is E2, the following relationship is satisfied: E2<E1. Each of E1 and E2 represents the length of the main body 1 including the external electrodes 3.

Figure 18:
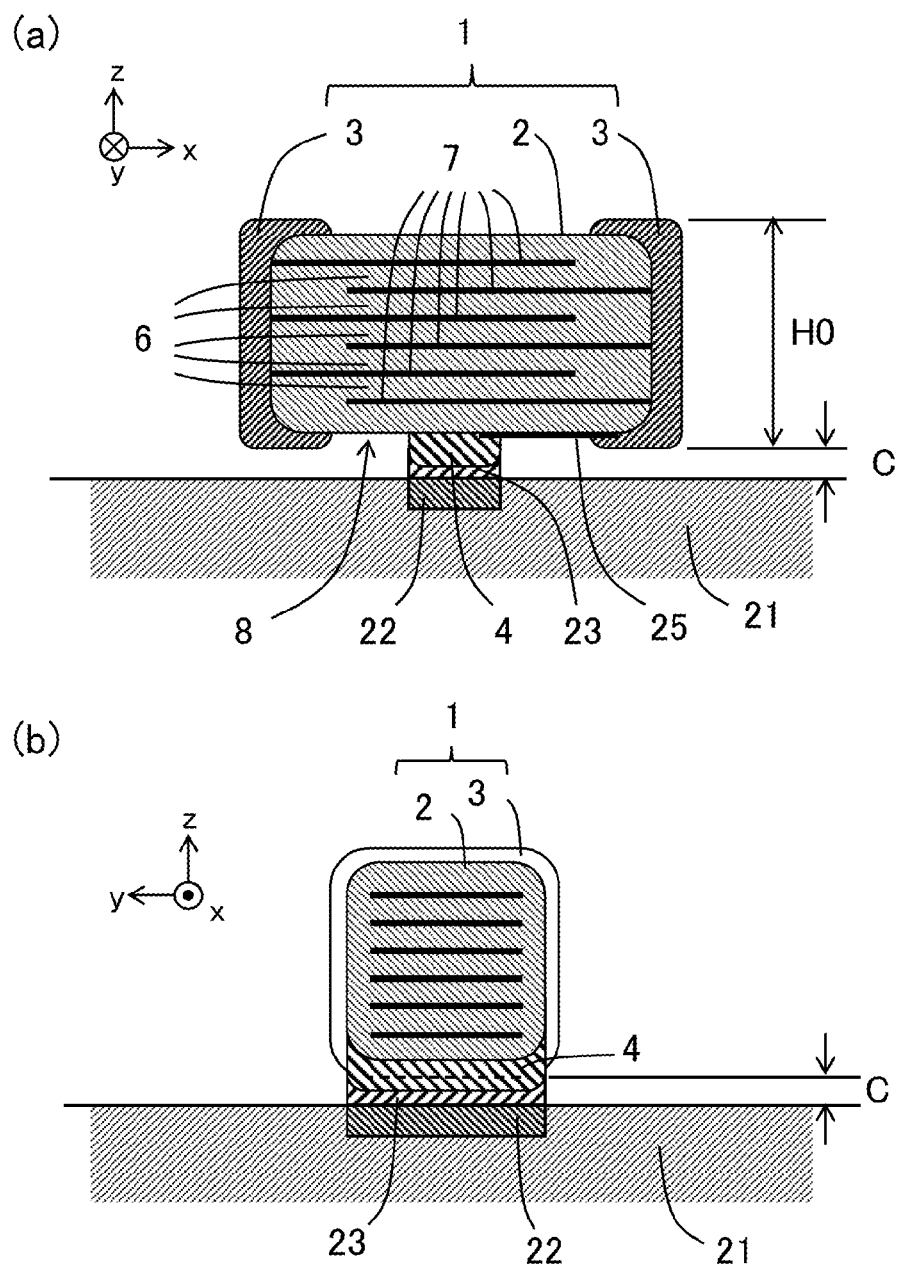
FIG. 18 is a sectional view showing a mounting structure, which is constructed by mounting the laminated electronic component according to the fifth embodiment on a substrate, and more specifically

As shown in FIG. 17, L1 represents the length of the first joining member 4 in the lengthwise direction of the first side 11, and P1 represents the length of the first joining member 4 lying on the line 15. Moreover, as shown in FIG. 18 which is a sectional view of the mounting structure according to this embodiment, H0 represents the height of the main body 1 in the stacking direction, and C represents the distance between the mounting face of the substrate 21 and the main body 1.

The first joining member 4 is formed on the surface of the stacked body 2 so as to be spaced away from the external electrodes 3. The first joining member 4 has electrical conductivity, and is electrically connected to one of the external electrodes 3 by the electric conductor 25. As materials for forming the first joining member 4, as is the case with the first to third embodiments, use can be made of, for example, a brazing material such as eutectic solder and lead-free solder (Sn—Ag—Cu solder), and a conductive adhesive.

The following describes a laminated electronic component mounting structure according to this embodiment. In the laminated electronic component mounting structure according to this embodiment, as shown in FIG. 18, the main body 1 is joined to the land pattern 22 on the substrate 21 via the first joining member 4, and, the first face 8 and the mounting face of the substrate 21 are opposed to each other. The first joining member 4 serves to join the main body 1 to the substrate 21, as well as to provide electrical connection between one of the external electrodes 3 of the main body 1 and an electric circuit (not shown) of the substrate 21. In this embodiment, the other one of the external electrodes 3 (the external electrode 3 which is not electrically connected to the first joining member 4) is electrically connected to the electric circuit of the substrate 21 by wire bonding or otherwise.

The result of vibration mode analysis made on the above-described conventional laminated electronic component (evaluation component) has showed that the central areas of the two faces opposed to each other in the stacking direction of the evaluation component, and more specifically, the center 8c of the first face 8 and a vicinal area are vibrated only in the stacking direction and are thus not vibrated in the planer direction of the stacked layers. Thus, in the case where the main body 1 is secured, at a part of the face at each end thereof in the stacking direction (for example, the first face 8), in a region which lies on the line 15 connecting the midpoints (the midpoints 11c) of the opposed paired sides (the first sides 11), viz., the nodal regions 24 and contains the center of the face (the center 8c of the first face 8) vibrating only in the stacking direction, to the substrate 21, it is possible to restrain piezoelectric vibration of the main body 1 against propagation through the substrate 21, and thereby suppress acoustic noise. In particular, in the case where the two pairs of the sides defining each of the faces opposed to each other in the stacking direction have different lengths, a line connecting the midpoints of the paired sides of longer length is shorter in line length, and is thus smaller in the difference in vibratory displacement between the midpoint of the line (the center 8c of the first face) and the end of the line (11c, viz., the nodal region 24) than a line connecting the midpoints of the paired sides of shorter length. Accordingly, by securing the main body 1 to the substrate 21 at its region lying on the line connecting the midpoints of the paired sides of longer length, it is possible to restrain piezoelectric vibration of the main body 1 against propagation through the substrate 21 even further, and thereby suppress acoustic noise.

In this embodiment, the first joining member 4 is disposed on a part of the main body 1 which is vibrated only in the stacking direction, and more specifically the region which lies on the line 15 connecting the midpoints 11c of the first sides 11 and contains the center 8c of the first face 8. Thus, the main body 1 can be secured, at its part which is vibrated only in the stacking direction, to the substrate 21.

Acoustic noise simulation was made on the following model of the fifth embodiment. In the first joining member 4, L1 was set at 200 μm, and P1 was set at 620 μm. Moreover, C in the mounting structure in this embodiment was set at 210 μm. Otherwise, the conditions to be fulfilled by the main body 1 are identical to those adopted in the acoustic noise simulation made on the evaluation component as described above. According to the result obtained by averaging the thereby obtained data throughout a frequency range of 5 Hz to 20 kHz, a 22 dBA reduction in the mean of sound pressure level was achieved in this embodiment as contrasted to the evaluation component, viz., the conventional mounting structure.

Although the ratio of L1 (200 μm) to E1 (1100 μm) (L1/E1) stood at 0.18 in this simulation, even when the ratio is 0.45, an about 10 dBA reduction in sound pressure level can be achieved as contrasted to the conventional case. Moreover, the smaller L1/E1 is, the likelier it becomes that the main body 1 is inclined with respect to the substrate 21 during mounting operation. In this regard, and also, from mountability standpoint, L1/E1 preferably falls in the range of 0.10 to 0.45. It is preferable that the ratio of P1 to E2 (P1/E2) is greater than or equal to 0.5 from mountability standpoint.

Moreover, where the external electrode 3 extends outwardly beyond the first face 8 of the stacked body 2 in the stacking direction, it is preferable that the thickness T1 of the first joining member 4 at the first face 8 is greater than the thickness T0 of the outwardly-extending part of the external electrode 3 at the first face 8. This makes it possible to avoid contact between the external electrode 3 of the main body 1 and the mounting face of the substrate 21 when mounting the laminated electronic component on the substrate 21, and thereby restrain piezoelectric vibration of the main body 1 from propagating through the substrate 21 via the external electrode 3.

In the laminated electronic component in this embodiment, given that the length of the first side 11 is E1 and the length of each of the paired sides contiguous to the first side 11 at the first face 8 of the main body 1 is E2, E1 is longer than E2 (E2<E1), but, E1 may be equal to E2 (E1=E2), or E1 may be less than E2 (E1<E2). However, in the case of E1<E2, on the line 15 on which the first joining member 4 is located, the difference in vibratory displacement in the main body 1 is increased with consequent reduction in acoustic noise suppression effect. In light of this, where the two pairs of the sides at the first face 8 of the main body 1 have different lengths, the paired sides of longer length are preferably defined as the first sides 11.

In the mounting structure in this embodiment, it is preferable that the ratio of C to H0 (C/H0) is greater than or equal to 0.1, wherein C represents the distance between the mounting face of the substrate 21 and the external electrode 3 of the main body 1. Moreover, in the interests of facilitating the installation of the laminated electronic component on the substrate 21 and achieving an improvement in mounting reliability, it is preferable that C is substantially equal to L1.

Laminated electronic components to which the present embodiment is applicable are similar in form and material to those to which the first to third embodiments are applicable, and further description thereof will thus be omitted. Moreover, also in this embodiment, the first joining member 4 may be disposed not only on the first-face 8 side of the main body 1 but also on the second-face 9 side thereof opposite the first-face 8 side.

Moreover, the first joining member 4 may have insulation capability. In this case, there is no need to provide the electric conductor 25, and, each external electrode 3 is electrically connected to the electric circuit of the substrate 21 by wire bonding or otherwise. Moreover, the first joining member 4 may be kept in direct contact with the external electrode 3. As an insulating material, thermoplastic resin such for example as ethylene vinyl acetate (EVA) or polypropylene (PP) is desirable for use.

Sixth Embodiment

Figure 19:
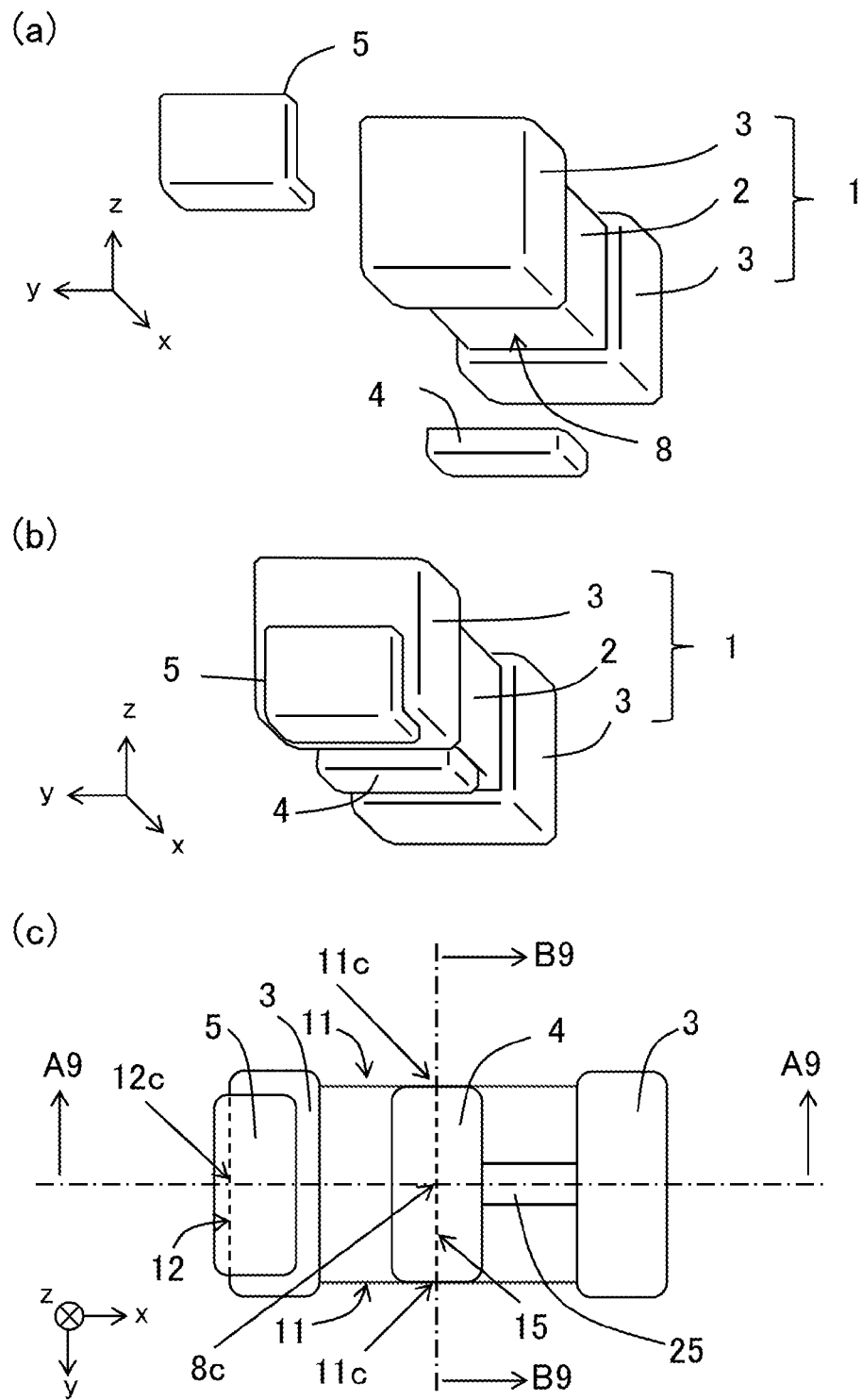
FIG. 19 is a view showing the laminated electronic component according to a sixth embodiment, and more specifically

In the sixth embodiment, as shown in FIG. 19, in addition to the first joining member 4 provided in the fifth embodiment, the second joining member 5 is provided. The second joining member 5 is formed so as to extend over a second side 12, which is one side of paired sides contiguous to the first side 11 at the first face 8 of the main body 1, and two faces adjoining the second side 12. The second joining member 5 may be disposed only on the first face 8, and, in this case, the second joining member 5 may be spaced away from the second side 12.

Figure 20:
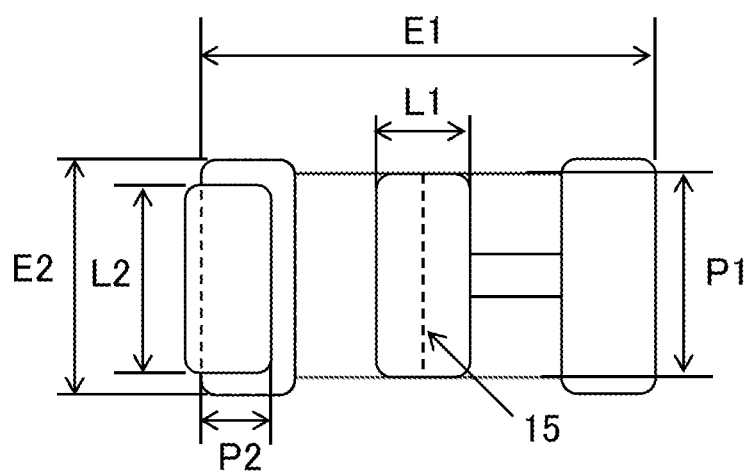
FIG. 20 is a plan view of the laminated electronic component according to the sixth embodiment as seen from the first face, illustrating the dimensions of constituent components.

As shown in FIG. 20, L2 represents the length of the second joining member 5 in the lengthwise direction of the second side 12, and, P2 represents the length of a part of the second joining member 5 on the first face 8 of the main body 1 which extends from the second side 12 toward the center of the first face 8 in a direction perpendicular to the second side 12. Moreover, as shown in FIG. 21(a), H2 represents the length in the stacking direction of a part of the second joining member 5 which lies on a side face of the main body 1 that is contiguous to the first face 8.

In this embodiment, the second joining member 5 is formed on the surface of the external electrode 3 located on the second side 12 side. The first joining member 4 and the second joining member 5 have electrical conductivity.

As materials for forming the first joining member 4 and the second joining member 5, as is the case with the first to fourth embodiments, use can be made of, for example, eutectic solder, lead-free solder (Sn—Ag—Cu solder), and conductive adhesives.

Figure 21:
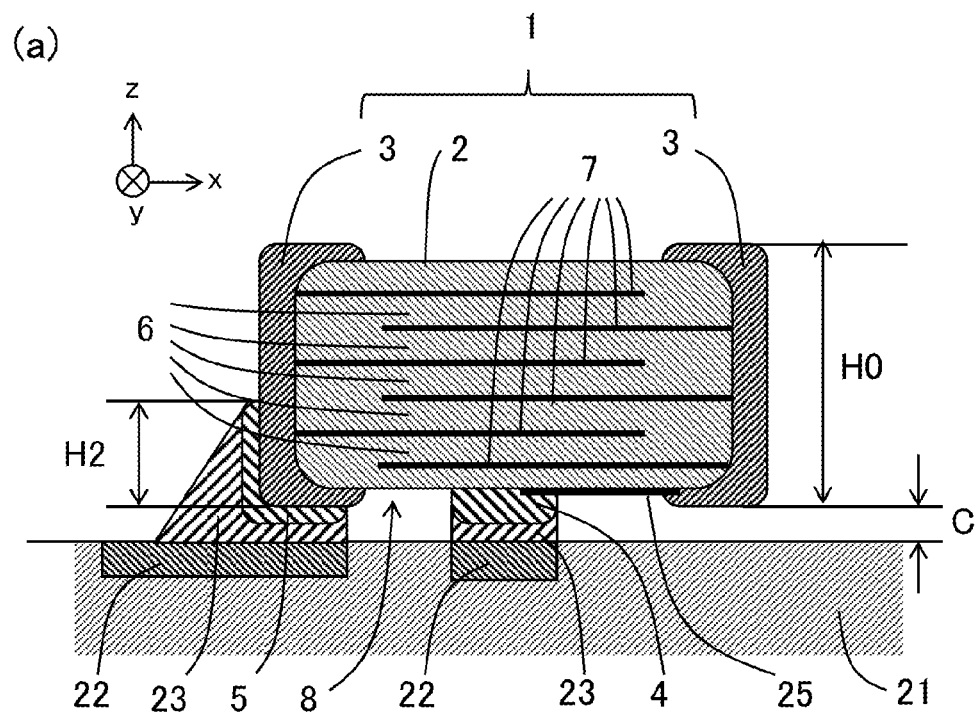
FIG. 21 is a sectional view showing a mounting structure, which is constructed by mounting the laminated electronic component according to the sixth embodiment on a substrate, and more specifically
Figure 21:
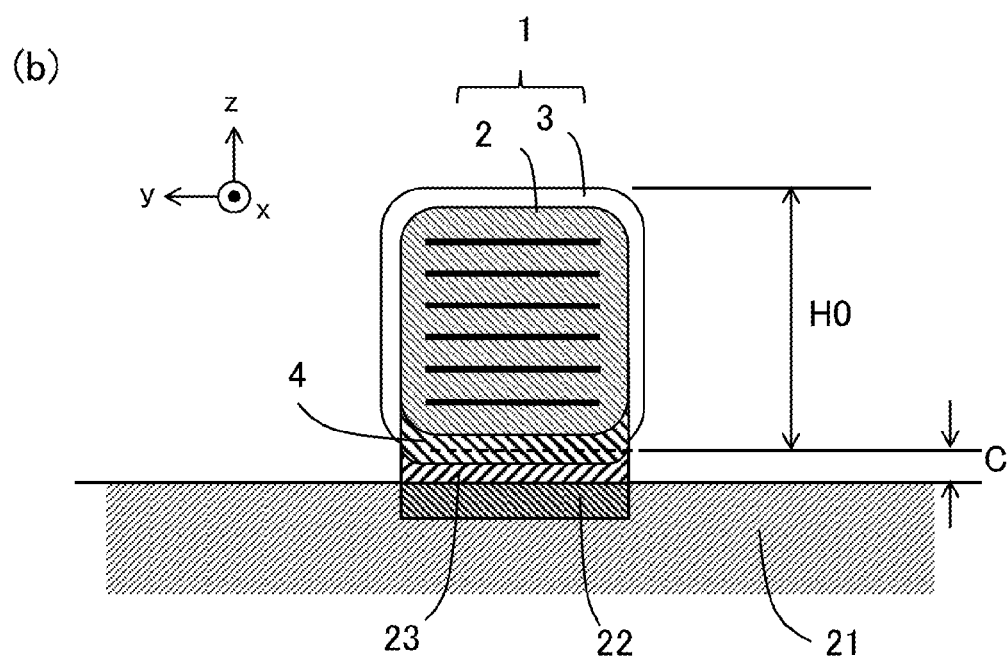

In a laminated electronic component mounting structure according to this embodiment, as shown in FIG. 21, the main body 1 is joined to the land pattern 22 on the substrate 21 via the first joining member 4 and the second joining member 5, and, the first face 8 and the mounting face of the substrate 21 are opposed to each other. The first joining member 4 and the second joining member 5 serve to join the main body 1 to the substrate 21, as well as to provide electrical connection between the external electrode 3 of the main body 1 and an electric circuit (not shown) of the substrate 21.

Acoustic noise simulation was made on the following model of the sixth embodiment. In the first joining member 4, L1 was set at 200 μm and P1 was set at 620 μm. In the second joining member 5, L2 was set at 620 μm, H2 was set at 0 μm, and P2 was set at 200 μm. Moreover, C in the mounting structure in this embodiment was set at 210 μm. Otherwise, the conditions to be fulfilled by the main body 1 are identical to those adopted in the acoustic noise simulation made on the evaluation component as described above.

According to the result obtained by averaging the thereby obtained data throughout a frequency range of 5 Hz to 20 kHz, a 17 dBA reduction in the mean of sound pressure level was achieved in this embodiment as contrasted to the conventional mounting structure.

While the ratio of L1 (200 μm) to E1 (1100 μm) (L1/E1) stood at 0.18 in this simulation, L1/E1 preferably falls in the range of 0.10 to 0.43. This is advantageous also from mountability standpoint. Moreover, a center line parallel to the line 15 of the first joining member 4 (a line passing through the centroid of the plane of the first joining member 4, which will hereafter be also referred to as "the centerline of the first joining member 4) does not necessarily have to coincide with the line 15 when seen in a plan view from the first face 8. Even if the centerline of the first joining member 4 is deviated from the line 15 by a distance equal to about 0.2 times E1, significant acoustic noise suppression effect can be attained.

Moreover, although the ratio of L2 (620 μm) to E2 (620 μm) (L2/E2) stood at 1.0, by setting the value of L2/E2 at 0.5, it is possible to achieve an about 20 dBA reduction in sound pressure level as contrasted to the conventional case. From mountability standpoint, L2/E2 is preferably greater than or equal to 0.4. It is advisable to place the second joining member 5 in a region including the above-described nodal region 24, viz., the midpoint 12c of the second side 12.

Moreover, the result of vibration mode analysis made on the evaluation component has showed that the center and a vicinal area of each surface constituting the evaluation component, as well as the midpoint and a vicinal part of each side establishing contact between side faces, exhibit great vibration amplitude. It is thus preferable that the ratio of P2 to E1 (P1/E1) is less than or equal to 0.25. Moreover, it is preferable that the ratio of H2 to H0 (H2/H0) is less than or equal to 0.4. It is preferable that the value of C is similar to that determined in the fourth embodiment.

Laminated electronic components to which this embodiment is applicable are similar in form and material to those to which the first to fifth embodiments are applicable, and further description thereof will thus be omitted. Moreover, also in this embodiment, the first joining member 4 and the second joining member 5 may be disposed not only on the first-face 8 side of the main body 1 but also on the second-face 9 side thereof opposite the first-face 8 side.

Moreover, either one or both of the first joining member 4 and the second joining member 5 may be designed to have insulation capability. In this case, the external electrode 3 is electrically connected to the electric circuit of the substrate 21 by wire bonding or otherwise.

In the first to sixth embodiments, the first joining member and the second joining member 5 have been illustrated as generally having a rectangular shape, and the preferable ranges of dimensions and ratios as to the design of these members as described above are thus based on this rectangular shape. However, the shape of the first joining member 4 and the second joining member 5 is not limited to the rectangular shape, but may be of other different shapes or an indefinite shape. Moreover, various changes and modifications may be made on the basis of the descriptions of the vibration mode of the laminated electronic component determined in the above-described simulation and the nodal region 24 without departing from the spirit and scope of the invention.

REFERENCE SIGNS LIST

1: Main body
2, 102: Stacked body
3, 103: External electrode
4: First joining member
5: Second joining member
6, 106: Dielectric layer
7, 107: Internal electrode layer
8: First face
9: Second face
10: First side face
11: First side
11c: Midpoint of the first side
12, 16: Second side
12c, 16c: Midpoint of the second side
13, 17: Third side
14: Fourth side
15: Line connecting midpoint of paired first sides
21: Substrate
22: Land pattern
23: Conductive layer
24: Nodal region
25: Electric conductor
31: Mounting substrate
32: Anechoic box
33: Sound-collecting microphone
34: Amplifier
35: FET analyzer
114: Solder
V: Vertex of main body

The invention claimed is:

1. A laminated electronic component, comprising:
a main body comprising:
a stacked body in which dielectric layers and internal electrode layers are alternately laminated in a stacking direction, the stacked body comprising an outer surface and vertexes, and
an external electrode disposed on the outer surface, having electrical connection with the internal electrode layers; and
a joining member,
the main body being shaped in a rectangular prism, and having a first face and a second face which are opposed to each other and are perpendicular to the stacking direction, wherein the first face comprises:
a first side having a first midpoint thereof;
a second side parallel to the first side, having a second midpoint thereof;
a third side contiguous to the first side and second side, having a third midpoint thereof;
a fourth side parallel to the third side, having a fourth midpoint thereof;
a first straight line connecting the first midpoint and the second midpoint; and
a second straight line connecting the third midpoint and the fourth midpoint,
the joining member being located on at least a part of the first straight line, the second straight line, or both the first straight line and the second straight line,
the joining member is not located on any of the vertexes of the main body, and
the joining member includes:
a first joining member elongated in a direction of the first straight line and located on the first straight line; and
a second joining member located on:
(i) one of the third side and the fourth side; or
(ii) the first face adjacent to one of the third side and the fourth side.

2. The laminated electronic component according to claim 1, wherein the main body is a laminated ceramic capacitor.

3. The laminated electronic component according to claim 1, wherein the following relationship is satisfied: E2<E1, where E1 represents a length of the first side, and E2 represents a length of the third side.

4. The laminated electronic component according to claim 1, wherein the external electrode comprises a first external electrode and a second external electrode,
the first external electrode is located on the third side,
the second external electrode is located on the fourth side,
the first joining member is electrically connected to the second external electrode via an electric conductor, and
the second joining member is disposed on the first external electrode.

* * * * *